(12) United States Patent
Peng

(10) Patent No.: US 10,014,317 B2
(45) Date of Patent: Jul. 3, 2018

(54) THREE-DIMENSIONAL NON-VOLATILE NOR-TYPE FLASH MEMORY

(71) Applicant: Haibing Peng, Houston, TX (US)

(72) Inventor: Haibing Peng, Houston, TX (US)

( * ) Notice: Subject to any disclaimer, the term of this patent is extended or adjusted under 35 U.S.C. 154(b) by 0 days.

(21) Appl. No.: 14/860,697

(22) Filed: Sep. 21, 2015

(65) Prior Publication Data

US 2016/0086970 A1 Mar. 24, 2016

Related U.S. Application Data

(60) Provisional application No. 62/053,798, filed on Sep. 23, 2014, provisional application No. 62/062,959, filed on Oct. 13, 2014, provisional application No. 62/097,079, filed on Dec. 28, 2014.

(51) Int. Cl.
*H01L 29/792* (2006.01)
*H01L 27/11582* (2017.01)
*H01L 27/11565* (2017.01)

(52) U.S. Cl.
CPC .. *H01L 27/11582* (2013.01); *H01L 27/11565* (2013.01)

(58) Field of Classification Search
CPC ......... B82Y 10/00; B82Y 30/00; B82Y 40/00; B82Y 15/00; H01L 51/0048; H01L 2924/00002; H01L 27/11565; H01L 27/11582; H01L 27/283; H01L 2924/00; H01L 51/0508; H01L 51/0579; H01L 21/28282
See application file for complete search history.

(56) References Cited

U.S. PATENT DOCUMENTS

| | | | | |
|---|---|---|---|---|
| 2009/0080246 | A1* | 3/2009 | Jenne | G11C 16/3418 365/185.02 |
| 2012/0184078 | A1* | 7/2012 | Kiyotoshi | H01L 27/1157 438/268 |
| 2014/0070290 | A1* | 3/2014 | Inumiya | H01L 43/10 257/295 |
| 2014/0340952 | A1* | 11/2014 | Ramaswamy | G11C 11/221 365/51 |

\* cited by examiner

*Primary Examiner* — Robert Bachner
(74) *Attorney, Agent, or Firm* — Dilworth IP, LLC

(57) ABSTRACT

The present invention provides a design of three-dimensional non-volatile NOR flash memory devices consisting of arrays of basic NOR memory group in which individual memory cells (field-effect-transistors) are stacked along a direction (or directions) either out of or parallel to the plane of the substrate and electrically connected in parallel to achieve high storage densities approaching 1 TB with lower manufacturing cost. Offering full random access to every individual memory cells and also capability of parallel programming/erasing in blocks of memory cells, such three-dimensional non-volatile NOR flash memory can be widely used for both executable-code storage and mass data storage applications.

10 Claims, 25 Drawing Sheets

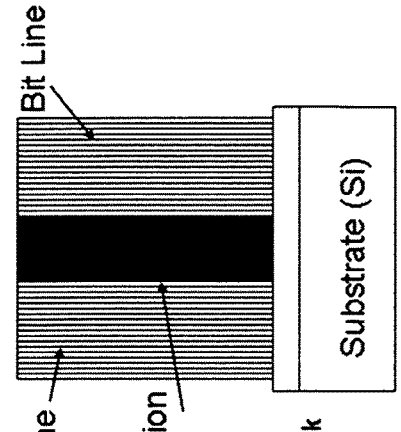
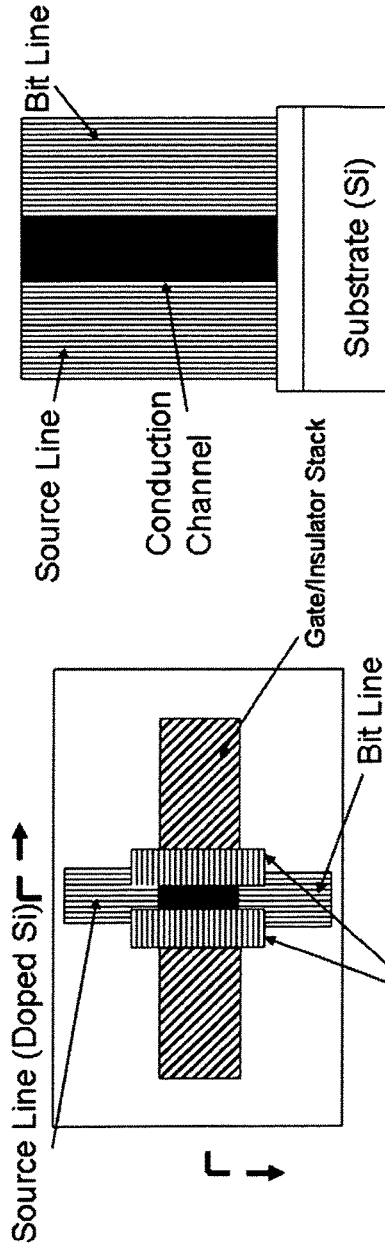
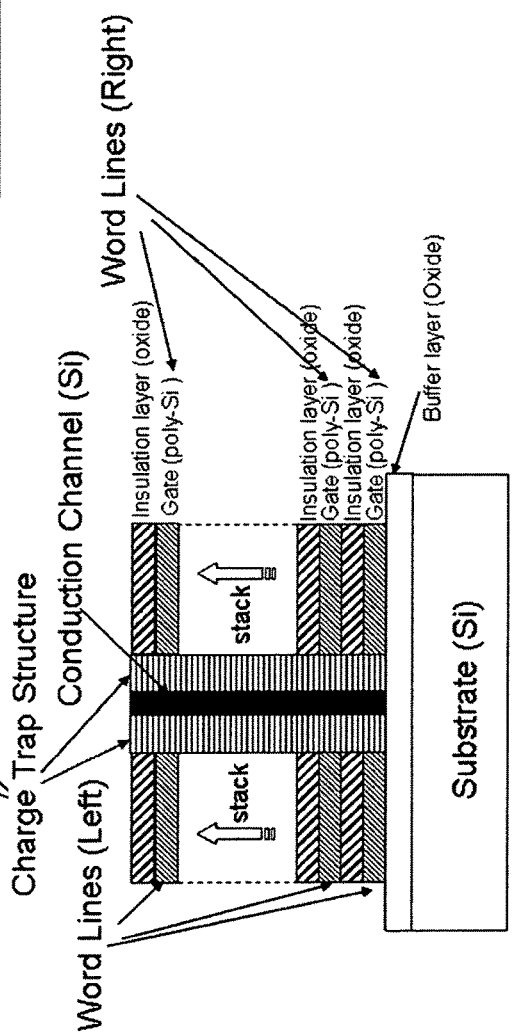

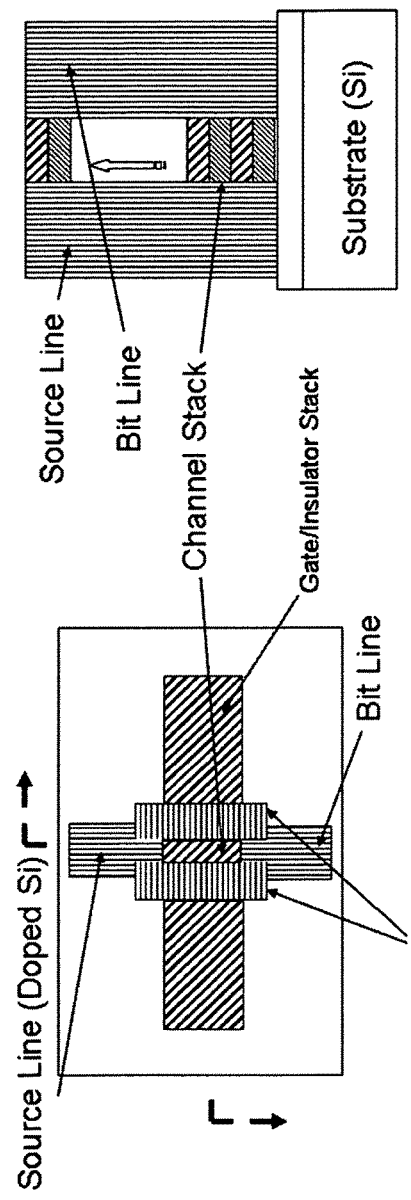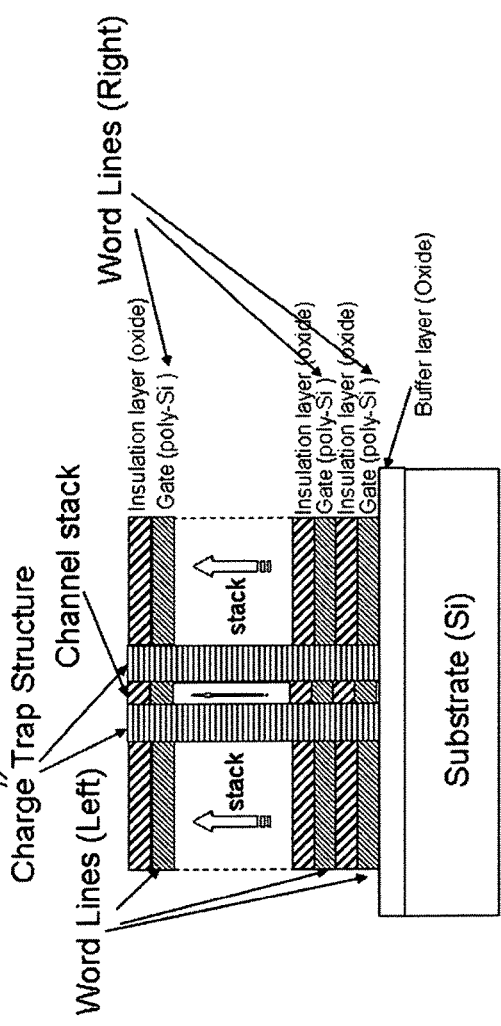

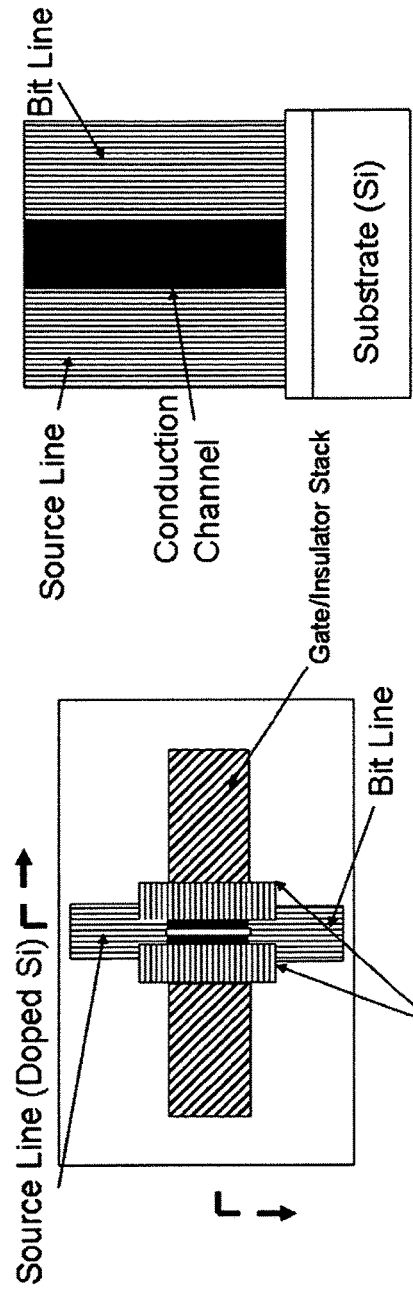
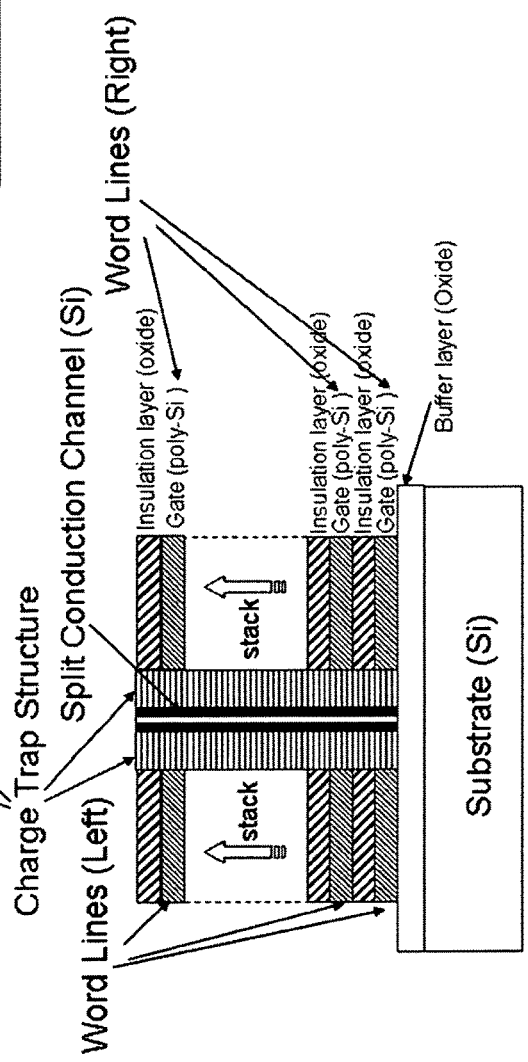

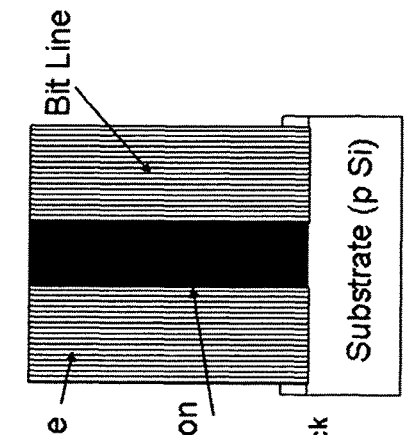
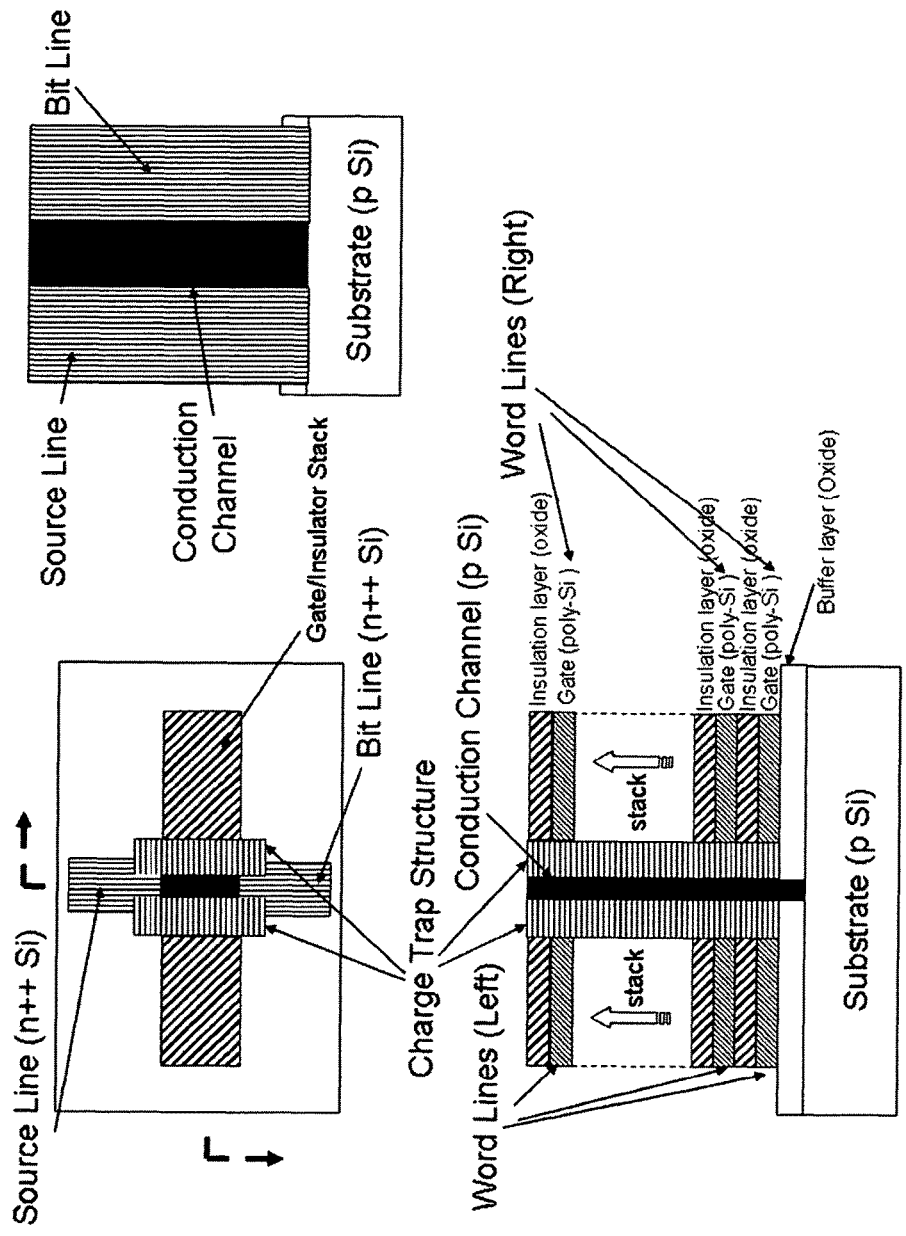

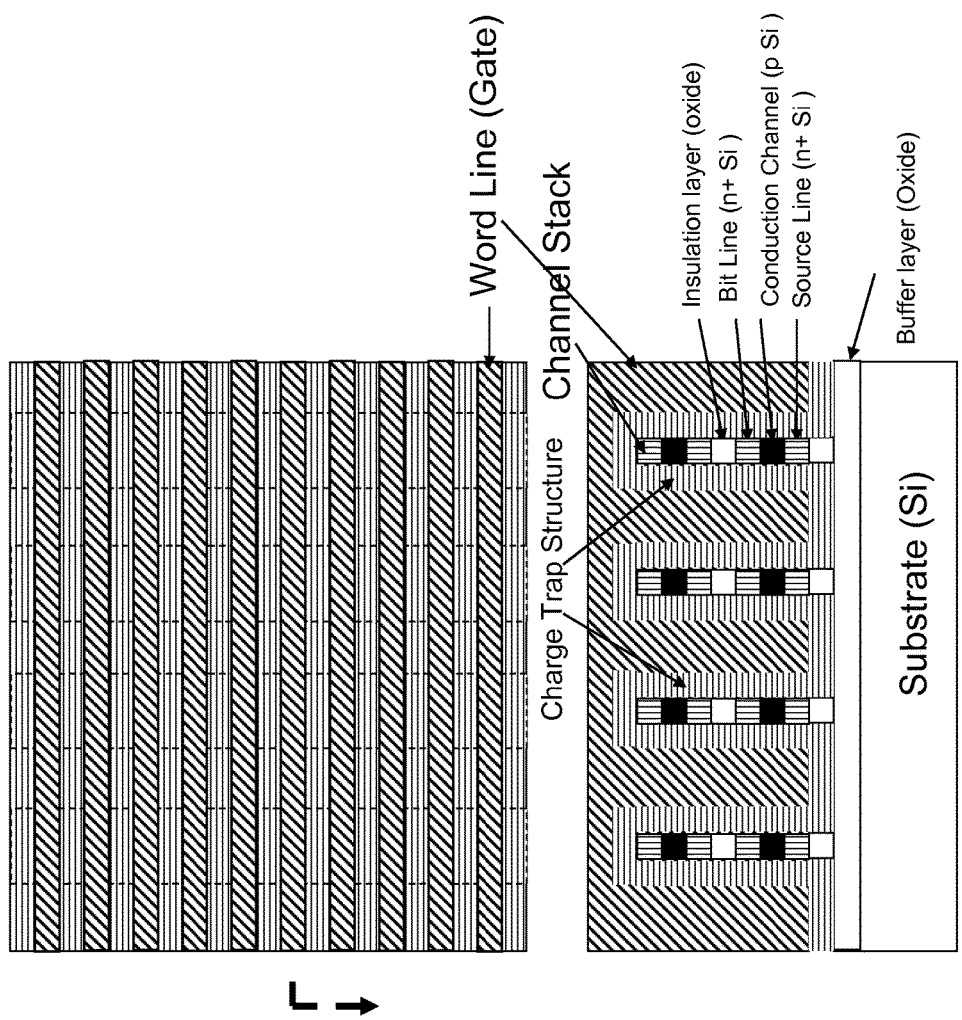

THREE-DIMENSIONAL NON-VOLATILE NOR-TYPE FLASH MEMORY

RELATED APPLICATIONS

This application claims the benefit of and priority to (1) U.S. Provisional Patent Application No. 62/053,798, entitled "THREE-DIMENSIONAL NON-VOLATILE NOR-TYPE FLASH MEMORY," filed Sep. 23, 2014; (2) U.S. Provisional Patent Application No. 62/062,959, entitled "THREE-DIMENSIONAL NON-VOLATILE NOR-TYPE FLASH MEMORY," filed Oct. 13, 2014; and (3) U.S. Provisional Patent Application No. 62/097,079, entitled "THREE-DIMENSIONAL NON-VOLATILE NOR-TYPE FLASH MEMORY," filed Dec. 28, 2014; the entire content of which are hereby incorporated by reference for all purposes as if set forth herein.

FIELD OF THE INVENTION

The present invention relates to three-dimensional non-volatile NOR flash memory devices with high storage density and random access to every individual memory cell.

BACKGROUND

Flash memory, a widely used non-volatile computer storage technology, usually employs a floating gate or a charge trapping structure to store charges in a field effect transistor (FET) as the memory cell. There are two main types of flash memory based on the logic gates for read operation: NAND type and NOR type. For NOR flash memory, every individual memory cell can be independently read or modified, which offers full random access and thus can be used for executable-code storage with non-volatility for replacing volatile SRAM or DRAM. On the other hand, with memory cells (FETs) electrically connected in series to form a basic NAND type memory group, NAND flash memory does not offer full random access functionality to every individual memory cell since the erasing of memory cells can only be done in a block instead of an individual cell. During the past decade, NAND Flash memory has been aggressively scaled with recent trend moving towards complicate three-dimensional NAND architecture, leading to a booming market of NAND flash memory in mass data storage applications (particularly in the growing mobile electronic devices). However, NOR flash memory provides significant advantage over NAND flash memory by offering a universal-type nonvolatile memory with full random access, and thus should be more competitive in commercial applications if the storage density of NOR flash memory can be comparable to NAND flash memory. Therefore, it is of significant technological importance to design three-dimensional NOR flash memory architecture with low manufacturing cost.

SUMMARY OF THE INVENTION

The present invention comprises: (1) a design of three-dimensional non-volatile NOR flash memory devices consisting of arrays of basic NOR memory group in which individual memory cells (i.e., FETs) are stacked along a direction either out of or parallel to the plane of the substrate and electrically connected in parallel (i.e., sharing the same source and drain electrodes) to achieve high storage densities; and (2) device fabrication processes to implement such three-dimensional non-volatile NOR flash memory devices.

BRIEF DESCRIPTION OF THE DRAWINGS

FIGS. 1a-1c show schematically a top view, a cross-sectional view from back (indicated by arrow), and a cross-sectional view from side (indicated by arrow), respectively, of a basic NOR memory group according to the present invention. This type of basic NOR memory group consists of vertically stacked FETs electrically connected in parallel as individual memory cells. A vertically oriented single piece of semiconductor (e.g., a silicon "fin") provides parallel conduction channels for all FETs within the basic NOR memory group. A multilayer conductor/insulator stack provides the gates (Word Lines) for every individual FETs stacked vertically. The electrodes for Source Line and Bit Line consist of two degenerately doped Si post.

FIGS. 2a-2c show schematically a top view, a cross-sectional view from back (indicated by arrow), and a cross-sectional view from side (indicated by arrow), respectively, of an alternative design of a basic NOR memory group according to the present invention. Here a vertical channel stack of alternating doped-semiconductor/insulator layers provides parallel conduction channels for all FETs within the basic NOR memory group. A corresponding multilayer conductor/insulator stack provides the gates (Word Lines) for every individual FETs stacked vertically.

FIGS. 3a-3c show schematically a top view, a cross-sectional view from back (indicated by arrow), and a cross-sectional view from side (indicated by arrow), respectively, of another alternative design of a basic NOR memory group according to the present invention. Here the semiconductor channel (silicon fin) is split into two pieces: one provides parallel conduction channels for the FETs in the left side and the other provides parallel conduction channels for the FETs in the right side.

FIGS. 4a-4c show schematically a top view, a cross-sectional view from back (indicated by arrow), and a cross-sectional view from side (indicated by arrow), respectively, of another alternative design of a basic NOR memory group according to the present invention. Here the conduction channel (Si fin) and the Source/Bit nodes directly contact the silicon substrate, and can be made either from directly etching a bulk Si substrate or from a Si layer (preferably epitaxial single-crystal Si layer) grown on top of a Si substrate.

FIGS. 8a-8d show schematic diagrams of an example fabrication process for implementing a three-dimensional NOR flash memory device consisting of arrays of the planar basic NOR memory group shown in FIG. 7. The top view (upper panel) and cross-sectional view (lower panel) of the device at different fabrication stages are presented. In this design, the left-side and the right-side gates of any basic NOR memory group are connected together.

DETAILED DESCRIPTION OF THE INVENTION

Figure 5A:
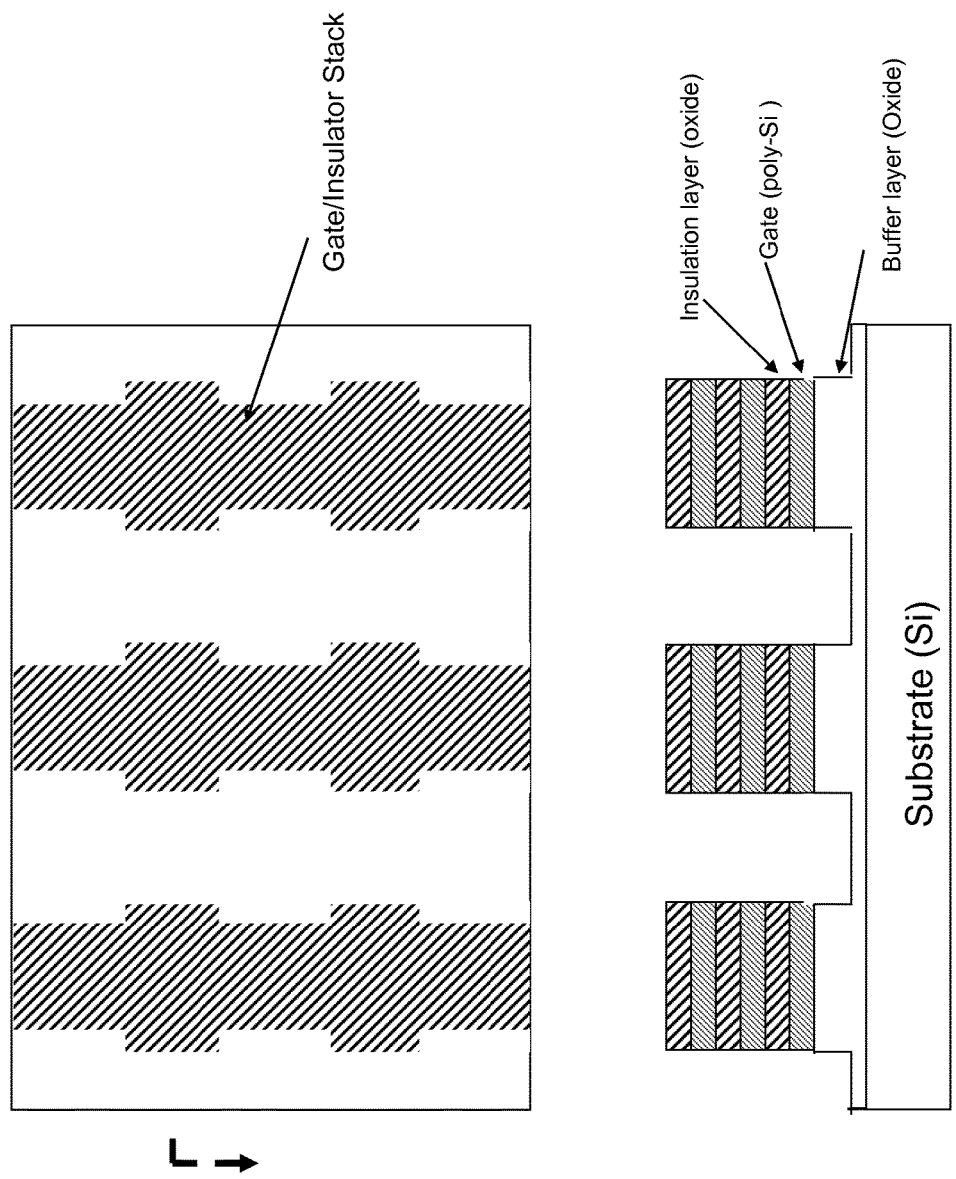
FIGS. 5a-5e show schematic diagrams of an example fabrication process for implementing a NOR flash memory device consisting of arrays of the basic NOR memory group shown in FIG. 1. The top view (upper panel) and cross-sectional view (lower panel) of the device at different fabrication stages are presented.

The present invention provides three-dimensional non-volatile NOR flash memory devices for increasing the storage density. The key components are: (1) basic NOR memory groups in which individual memory cells (i.e., FETs) are stacked along a direction out of the plane of the substrate and electrically connected in parallel (i.e., sharing the same source and drain electrodes) to achieve high storage densities; (2) basic NOR memory groups in which individual memory cells (i.e., FETs) are stacked along a direction parallel to the plane of the substrate and electrically connected in parallel (i.e., sharing the same source and drain electrodes); and (3) device fabrication processes to implement three-dimensional non-volatile NOR flash memory devices consisting of arrays of the designed basic NOR memory groups.

In one embodiment, the present invention comprises a basic NOR memory group consisting of FETs vertically connected in parallel as individual memory cells, as illustrated in FIG. 1. Such basic NOR memory groups will be connected in arrays on chip to form non-volatile three-dimensional NOR flash memory devices. Here a vertically oriented single piece of semiconductor (denoted as a semiconductor "fin") provides parallel conduction channels for all FETs within the same basic NOR memory group; the semiconductor fin (e.g., Si or Ge fin) can have a cuboid or other regular/irregular shape, and the direction of electrical current flow is approximately parallel to the substrate plane when a FET is in the ON state. A multilayer conductor/insulator (e.g., heavily doped poly-Si/SiO$_2$, or metal/oxide) stack provides the gates (Word Lines) for every individual FETs stacked vertically. The electrodes for Source Line and Bit Line consist of two degenerately doped semiconductor post (preferably made of the same semiconductor material as the channel). The charge trap structure can be a dielectric multilayer, such as ONO sandwich structure (i.e. silicon oxide/silicon nitride/silicon oxide), Al$_2$O$_3$/silicon nitride/silicon oxide, or H$_f$O$_2$/silicon nitride/H$_f$O$_2$ sandwich structure, where silicon nitride functions as the trap for charge retention inside the gate dielectrics. To function as NOR gate logics in reading scheme, the doping configurations of the conduction channel (taking Si fin as an specific example) and the electrodes of Source and Bit Lines (taking degenerately doped Si as an example) are preferred to be as follows (in the case that an inversion layer serves as the electrical conduction path in the FET ON state): (i) the channel is p-doped Si while these two electrodes (Source and Bit Lines) are degenerately n-doped Si; or (ii) the channel is n-doped Si while these two electrodes (Source and Bit Lines) are degenerately p-doped Si. In the case that an accumulation layer serves as the electrical conduction path in the FET ON state, the channel can be a resistive undoped Si while these two electrodes (Source and Bit Lines) are degenerately doped Si with either type of carrier. A basic requirement of workable doping configurations of the conduction channel and the electrodes is to ensure that there should be no conduction path between the source and the drain electrodes when all FETs within the same basic memory group are in the OFF state.

Another unique feature of the basic NOR memory group of FIG. 1 is the double side-gate structure, which provides versatile functionality in control depending on the silicon fin width $t_{fin}$ (i.e., the separation sandwiched between two charge trap structures as shown in FIG. 1b). In case 1, if $t_{fin}$ is large enough (e.g., in an estimated preferred range of ~20 nm to 100 nm) so that the effect of the right and left side-gates is decoupled, in each layer there are effectively two independent FETs (memory cells) controlled by the left and the right gate, respectively, and therefore the right-side and the left-side Word Lines can be treated as independent as well. In case 2, if $t_{fin}$ is small so that the effect of the right and left gate is coupled strongly, the corresponding left-side and right-side Word Lines can be connected together as a single Word Line (otherwise, the situation may be too complicated as multi-levels occur), or one side of the Word Lines can simply be floated and used as a backup until the memory cell on the other side is worn out after certain program/erase cycles. Alternatively, in the above case for small $t_{fin}$ when the effect of the right and left gate is coupled strongly, each individual memory cell (consisting of a shared conduction channel and two side-gating structures) can be operated as a multilevel charge trap flash memory cell by using the combination of these two side-gates, i.e., each individual memory cell can store up to 4 bits of information if trapped charges near the source and the drain electrodes of the FET are employed to store two separate bits with one side-gate.

In an alternative embodiment, the present invention comprises a second configuration of the basic NOR memory group (FIG. 2). Here a vertical channel stack of alternating doped-semiconductor/insulator layers (e.g., doped poly-Si/SiO$_2$) provides parallel conduction channels for all FETs within the basic NOR memory group. A corresponding multilayer conductor/insulator stack (e.g., doped poly-Si/SiO$_2$), aligned vertically with the channel stack, provides the gates (Word Lines) for every individual FETs stacked vertically.

In another alternative embodiment, the present invention comprises the third configuration of the basic NOR memory group (FIG. 3). Here the semiconductor channel (silicon fin) is split into two pieces: one provides parallel conduction channels for the FETs in the left side and the other provides parallel conduction channels for the FETs in the right side. The space between the separated two pieces of semiconductor channel can be filled with insulation layer and thus the effect of a left-side gate and the corresponding right-side gate is decoupled.

In alternative embodiments of the present invention, the configuration of the basic NOR memory groups of FIGS. 1 and 3 can be modified so that the conduction channel and the Source/Bit Line electrodes directly contact the silicon substrate. In this case, to minimize leakage current between the Bit and the Source Lines when all FETs are in the OFF state, the conduction channel should have the same dopant type as the substrate (if using doped Si wafer), e.g., a p-doped (n-doped) Si conduction channel on top of a p-doped (n-doped) Si substrate; or a resistive intrinsic Si substrate can be used. The preferred doping configurations of the conduction channel and the electrodes of Source and Bit Lines are the same as what was described previously for the basic NOR group of FIG. 1, so that there should be no conduction path between the source and the drain electrodes when all FETs within the same basic memory group are in the OFF state. FIG. 4 presents such a modified basic NOR memory group with a p-doped Si fin as the conduction channel on top of a p-doped Si substrate. The silicon fin (conduction channel) can be made either from directly etching a bulk Si substrate, or from a Si layer (preferably epitaxial single-crystal Si layer) grown on top of a Si substrate.

In one alternative embodiment, the basic NOR memory groups of FIGS. 1-4 can be modified so that only part of the left-side and/or right-side gates are presented.

In some other alternative embodiments, the conduction channel (i.e., a single piece of semiconductor such as a silicon fin, or two separated pieces of semiconductor) of the basic NOR memory group depicted in FIGS. 1, 3 and 4, and the channel stack depicted in FIG. 2 can be oriented along any direction (or meandering directions) out of the plane of the substrate, instead of oriented vertically. Also, the exact shape of the conduction channel (e.g., Si fin) can be varied as long as individual memory cells in the same group are electrically connected in parallel (i.e., sharing the same source and drain electrodes) to implement NOR gate logic.

In one embodiment, the present invention comprises a read/write scheme with full random access to every individual memory cells in the basic NOR memory group of FIGS. 1 and 2. To read the state of a specific individual memory cell (i.e., a FET), the following scheme is proposed: first, the desired basic NOR memory group containing the target memory cell is selected; next, the Word Line of the target memory cell to read is set at a suitable control voltage level $V_{read}$ where the state of the corresponding FET is purely determined by the charge trap state, while all other Word Lines in the selected memory group are set at a control voltage $V_{off}$ (so that the corresponding FETs are turned off regardless of the trap charge state); finally, the output signal at the Bit Line of the selected group is read to provide information on the state of the target memory cell (if the target cell is in a state with trapped charges being able to turn on the associated FET, the Bit Line will be pulled low to the state "0"; otherwise, the Bit Line will stay high at the state "1"). As typical for NOR flash memory, the read scheme follows NOR gate logics.

Programming can be done either on just one individual memory cell, or in parallel on any number of selected memory cells in a basic NOR memory group. To program an individual memory cell, the desired basic NOR memory group containing the target memory cell is selected so that the Bit Line is set at a positive voltage level $V_{cc}$ (e.g., 3-5 V) while the Source Line is grounded. After that, the Word Line of the target memory cell to program is set at a suitable control voltage level $V_{pgm}$ (e.g., 6-12 V) for a short period where electrons can tunnel into the charge trap (e.g., silicon nitride) near the drain side (e.g. via channel hot electron injection), while all other Word Lines in the selected memory group are floated or set at a moderate voltage level smaller than $V_{pgm}$ (so that their trap charge states are undisturbed). To program a number of selected memory cells in a group in parallel, the only difference lies in the last step, where the Word Lines of all target memory cells are set at the control voltage level $V_{pgm}$ for a short period simultaneously while keeping other Word Lines floated. This parallel programming process provides significant advantage in boosting the writing speed. In addition, since the stored charges are localized in the dielectric charge trap (silicon nitride), one can also switch the Source and Bit Line to store another bit of information in the same memory cell at the charge trap segment near the other end of the channel (so that a two-bit cell configuration is realized). Alternatively, programming can also be done via Fowler-Nordheim tunneling, where the selected Bit Line is floated (or grounded) and the selected Source Line is grounded when the Word Line of the target memory cell to program is set at a suitable positive control voltage level $V_{pgm}$ for a short period so that electrons can tunnel into the charge trap (e.g., silicon nitride) near the source side (or from the channel).

Erasing can also be done either on just one individual memory cell, or in parallel on all cells in a basic NOR memory group. To erase an individual memory cell, the desired basic NOR memory group containing the target memory cell is selected so that the Bit Line is floated. The Source Line is then set at an erasing voltage level $V_{erase}$ for a short period with the Word Line of the target memory cell to erase being grounded (so that electrons can tunnel out from the charge trap near the source side) and while all other Word Lines in the selected memory group are set a control voltage $V_{pass}$ (so that their trap charge states are protected). Similarly, one can also switch the Source and Bit Line to erase another bit of information in the same memory cell at the charge trap segment localized near the other end of the channel (if a two-bit cell configuration is used). To erase all cells in a group in parallel, both the Source Line and Bit Line are set at the erasing voltage level $V_{erase}$ for a short period with all Word Lines of the target group to erase being grounded (so that electrons can tunnel out from all charge traps). This parallel erasing process can also be done in a larger block containing many basic groups, thus providing fast erasing speed. Alternatively, erasing of memory cells can also be done via channel hot hole injection to neutralize the stored electrons in charge traps, e.g., by setting the target Bit Line at a negative voltage level $V_{dd}$ (e.g., −3 to −5 V) and grounding the target Source Line while the Word Line of the target memory cell is set at a suitable erase voltage level $V_{GErase}$ (e.g., −6 to −12 V) for a short period where holes can tunnel into the charge trap near the drain side to neutralize the stored electrons. Similarly, hot holes can also be injected from the source side by switching the voltage applied on the Source/Bit lines.

Alternatively, in principle each individual memory cell can also function as a multi-level memory cell by applying suitable voltage levels on the Word/Bit/Source Lines during programming/erasing/reading processes.

Figure 5B:
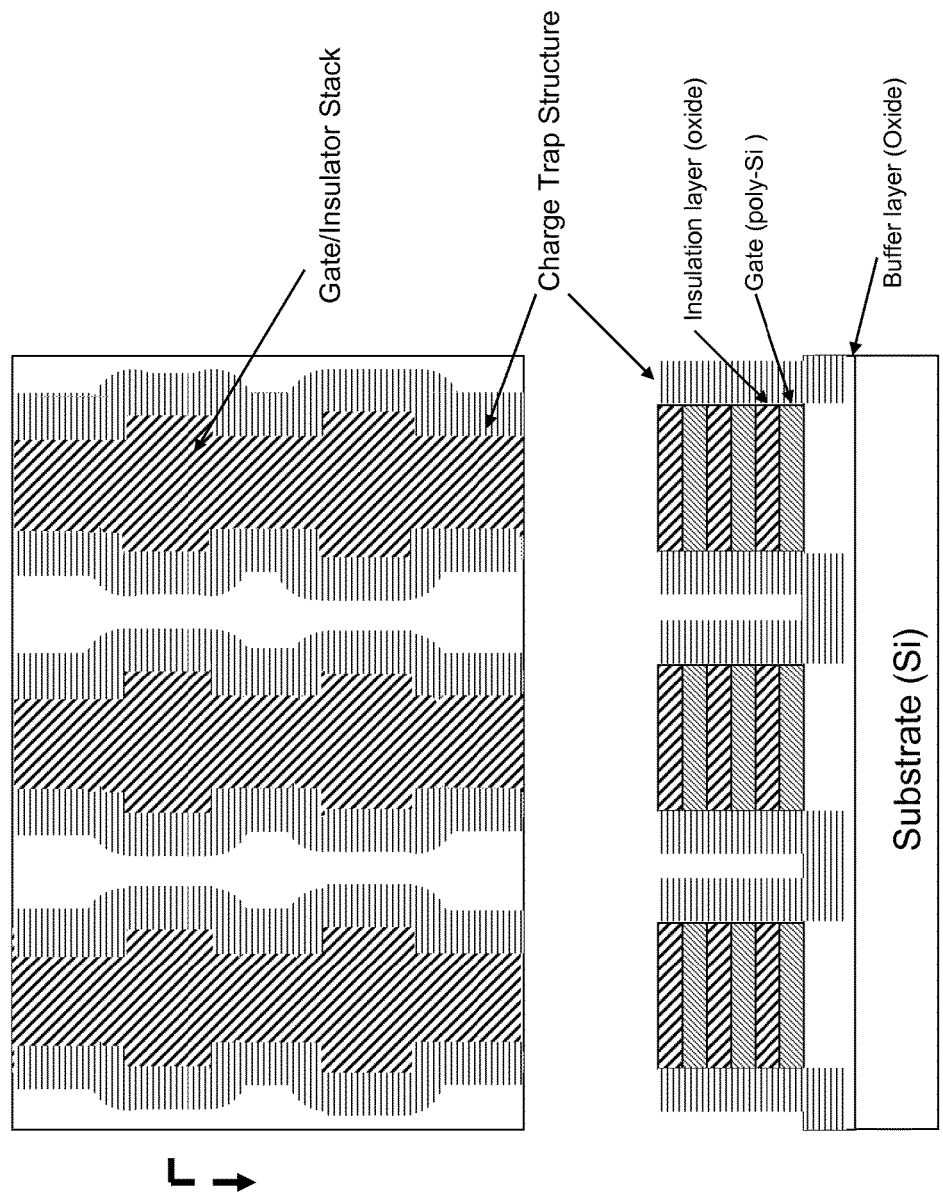
Figure 5C:
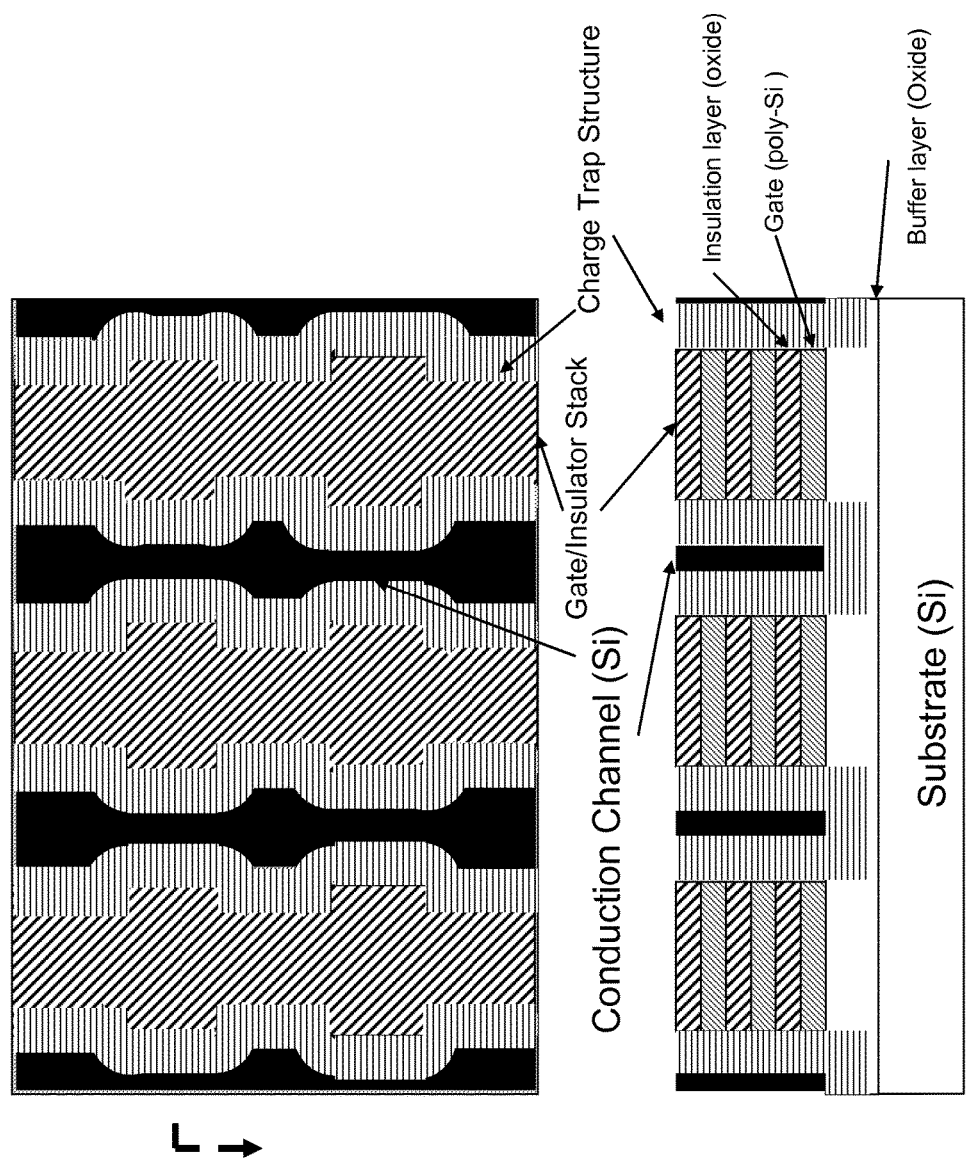
Figure 5D:
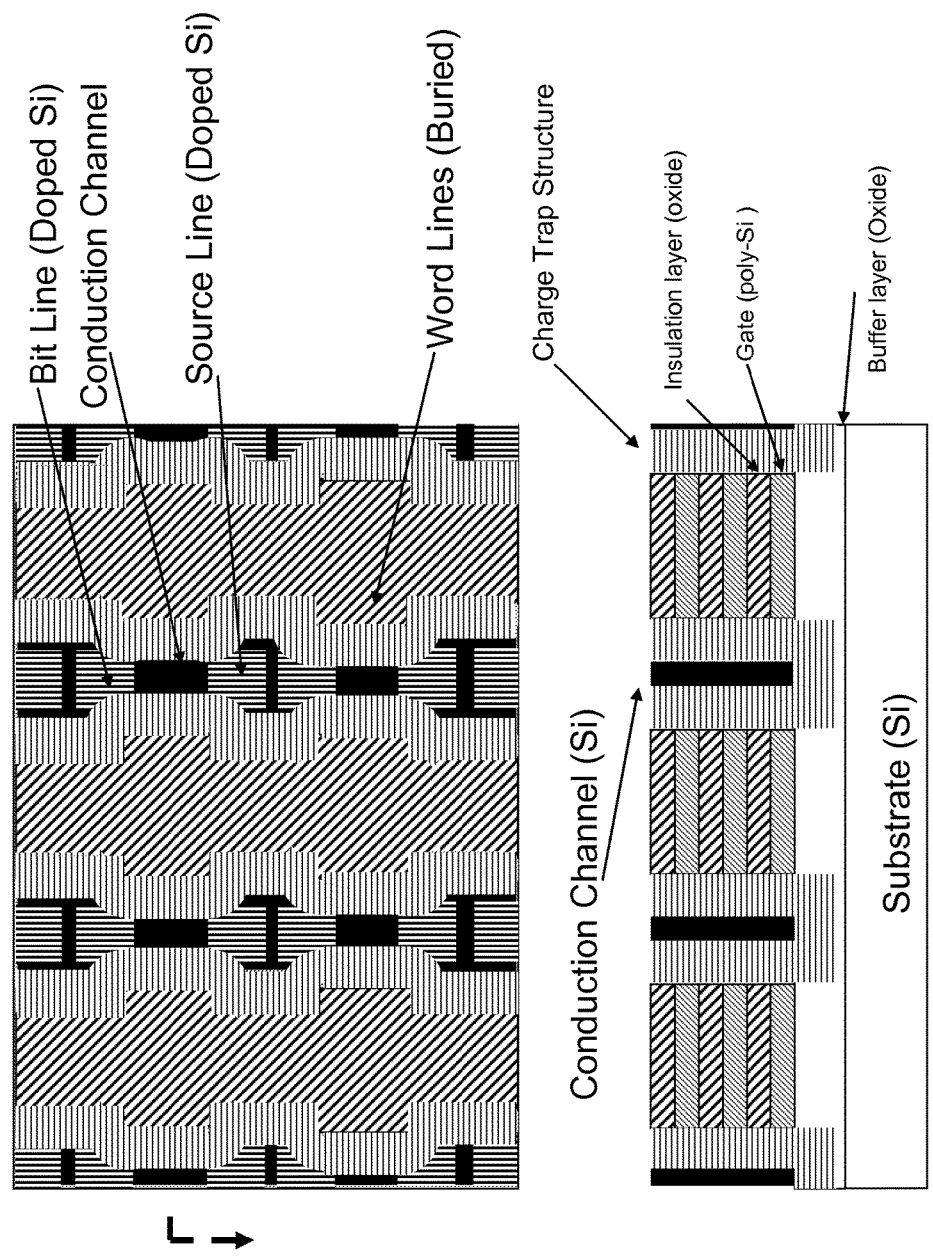
Figure 5E:
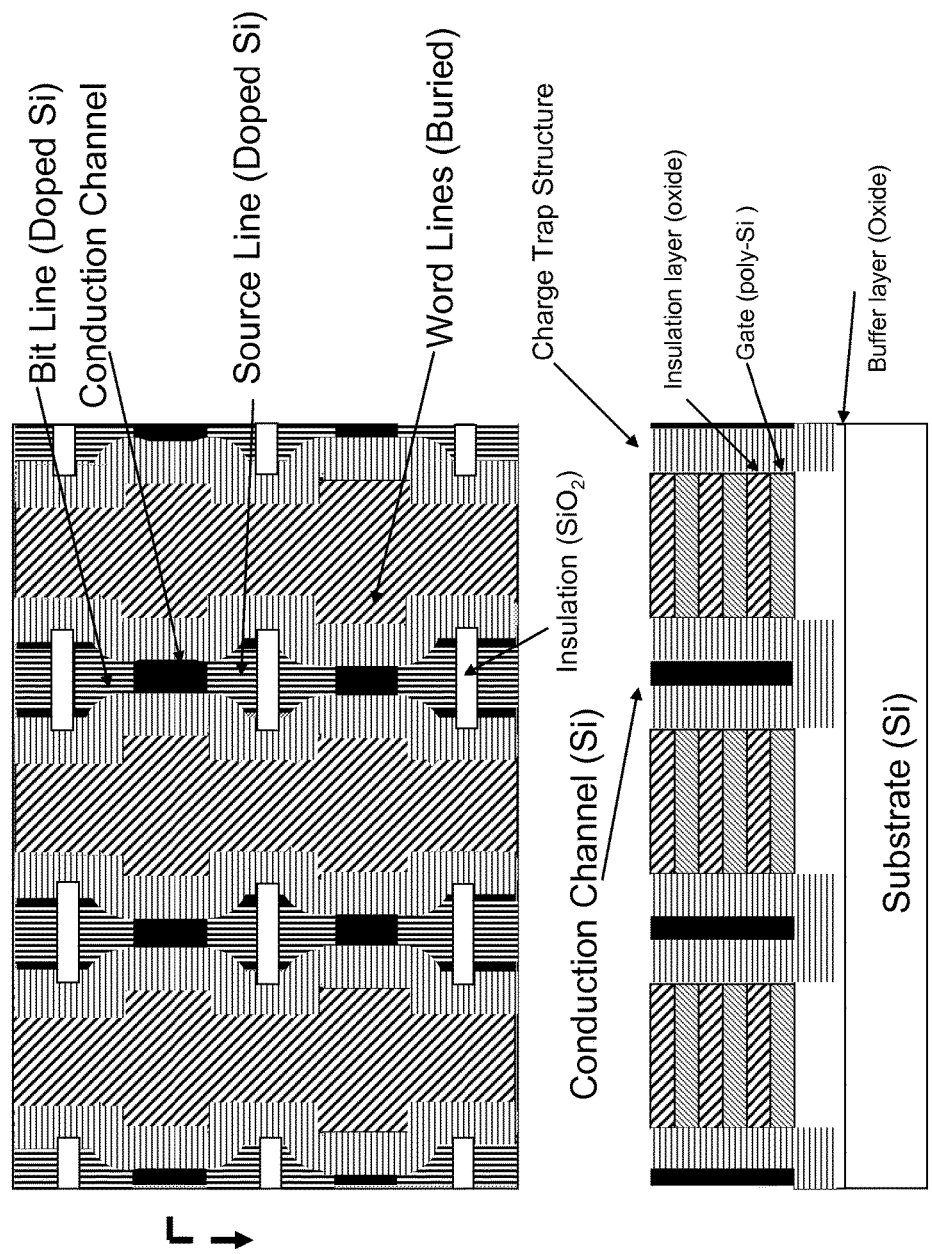

In some embodiments, the present invention comprises device fabrication methods for implementing arrays of the basic NOR memory group of FIG. 1 to form three-dimensional NOR memory. One example of detailed device fabrication process is illustrated in FIGS. 5a-5d. First, a buffer layer of $SiO_2$ (or other insulator) typically in the order of 100 nm thick is deposited on a Si wafer, followed by a deposition of a stack of alternating gate/insulation layers via techniques such as LPCVD, ALD, PECVD, physical vapor deposition and etc. In one example, the gate layer can be heavily doped poly-Si prepared by LPCVD (or TaN, or tungsten prepared by CVD), and the insulation layer can be $SiO_2$ prepared by LPCVD. In an alternative example, the gate layer can be a conducting layer (e.g. TiN or metals) prepared by atomic layer deposition (ALD), and the insulation layer can be $HfO_2$, $Al_2O_3$, or $ZrO_2$ prepared by ALD. The thickness of the gate and insulation layers can be varied depending on the desired storage density and the performance, although typical thickness of the gate layer can be from 10 nm to 500 nm and the insulation layer should be sufficiently thick (e.g., >30 nm in some embodiments) to suppress interference between neighboring memory cells during operations. After that, the gate/insulation multilayer stack is etched into stripes as shown in FIG. 5a, via techniques such as masked ion-milling, or other dry etching and wet etching methods. Next, a dielectric charge trap structure is prepared to coat the side walls of the gate/insulation stack (FIG. 5b). The charge trap structure can be a ONO sandwiched structure including a tunneling dielectric layer such as silicon oxide (O), a charge storage layer such as silicon nitride (N), and a blocking dielectric layer such as silicon oxide (O), which can be prepared by techniques such as LPCVD. In a representative embodiments, the tunneling dielectric layer can be 2 nm thick silicon oxide, the charge storage layer can be 5 nm thick silicon nitride, and the blocking dielectric layer can be 5.5 nm thick silicon oxide, which gives a total effective gate dielectric thickness of 12.5 nm (workable for effective charge tunneling at gate voltage of 10 V or less during program/erase operations), but the thickness of each layer can be optimized depending on the operation voltage and speed for programming/erasing. In an alternative embodiment, the silicon oxide layer of the ONO structure can be replaced by high κ dielectrics such as $Al_2O_3$ or $H_fO_2$ prepared by ALD. In another alternative embodiment, a bandgap engineered ONO structure can be used where the tunneling dielectric layer includes composite materials (e.g., 1 nm silicon oxide/2 nm silicon nitride/2.5 nm silicon oxide structure) to assist electron tunneling. Subsequently, epitaxial silicon or poly-silicon is deposited by CVD or LPCVD to form the conduction channel, and then the device is planarized by chemical-mechanical polishing (CMP) (FIG. 5c). In the case that epitaxial silicon is grown by CVD (not shown in FIG. 5c), the bottom of the trenches need to be etched beforehand to expose the Si substrate (followed by surface cleaning), and a thin sacrificial layer such as amorphous silicon can be deposited to protect the sidewall ONO structure before this additional etching step. After that, the Source- and Bit-Line nodes are formed by masked doping via ion implantation (all the way through the Si layer) in selected area (FIG. 5d). The silicon fin width $t_{fin}$ for the conduction channel are preferably from 20 nm to 200 nm to reduce the coupling between the left and the right gates in the same layer. As previously discussed, to function as NOR gate logics in reading scheme, the doping configurations of the conduction channel and the electrodes of Source and Bit Lines are preferred to be: the channel is p-doped (n-doped) Si while these two electrodes (Source and Bit Lines) are degenerately n-doped (p-doped) Si (for the case that an inversion layer serves as the electrical conduction path in the FET ON state). Next, the Bit/Source electrode nodes (doped Si pads in FIG. 5d) for adjacent memory groups in the same column are separated electrically by etching away the Si section between the adjacent Bit/Source nodes (doped Si pads) and then the etched space is filled with an insulation layer such as $SiO_2$ (FIG. 5e). In another configuration alternative to that of FIG. 5e, the adjacent Bit/Source nodes (doped Si pads in FIG. 5d) can be electrically connected and shared by adjacent memory groups in the same column to form a virtual-ground NOR architecture. It is worthwhile to note that in the final device with periodically arranged arrays of basic NOR memory groups (FIG. 5e), all basic memory groups in the same column share the same stack of Word Lines. To form a larger NOR block, the Bit (Source) Line nodes of the basic memory groups of every other column in the same row can be connected together to form a Local Bit (Source) Line, resulting in two Local Bit (Source) Lines in one row to address relevant cells in even or odd columns separately. Such larger NOR blocks can be connected on the chip level via additional transistors (e.g., by connecting the aforementioned Local Bit/Source Lines to Global Bit/Source Lines via selection transistors) and thus can be selectively addressed by an address decoder, and for a selected NOR block read/programming/erasing can be done on any individual cell with full random access and programming/erasing can also be done in parallel on multiple cells by following the aforementioned read/write scheme (now treating the larger block as an effective basic group). Electrical access to the buried gate layers of FIG. 5e can be realized (as typically proposed for 3D NAND Flash memory devices) by etching a stair-case pattern into the layers near the edge of the memory arrays, subsequently depositing an insulation layer followed by CMP, etching vias down to connect with buried gate layers and filling the vias with conductors.

Figure 6A:
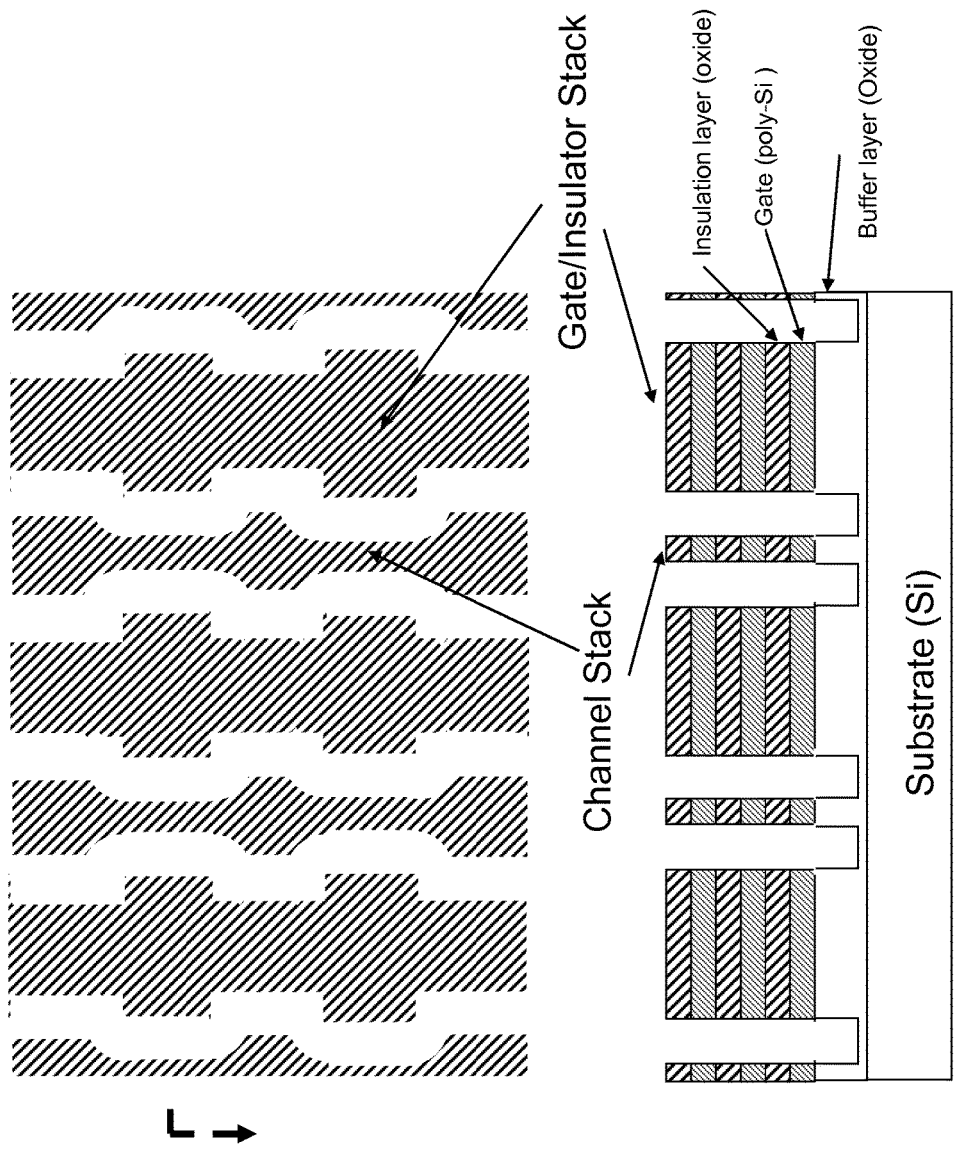
FIGS. 6a-6c show schematic diagrams of an example fabrication process for implementing a NOR flash memory device consisting of arrays of the basic NOR memory group shown in FIG. 2. The top view (upper panel) and cross-sectional view (lower panel) of the device at different fabrication stages are presented.
Figure 6B:
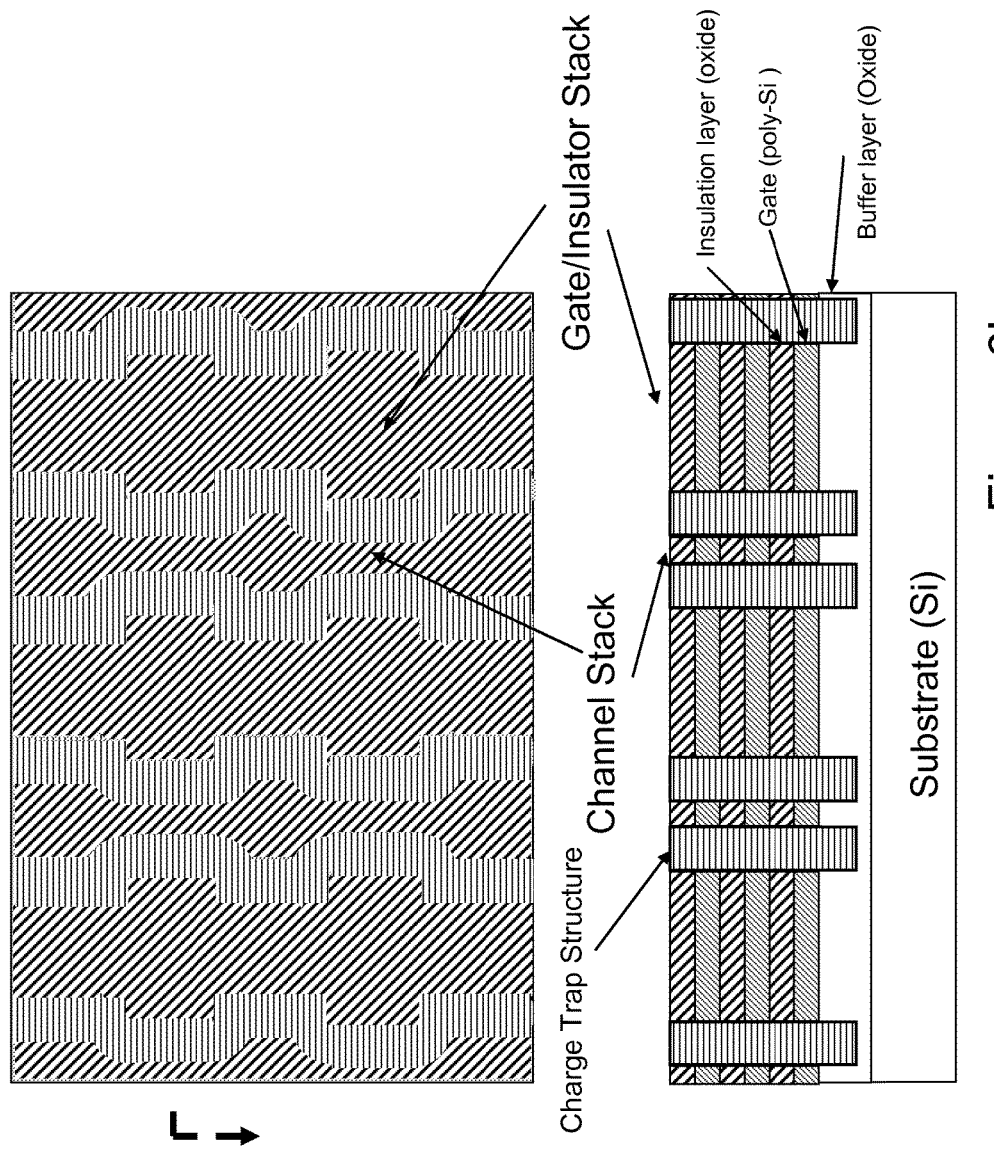
Figure 6C:
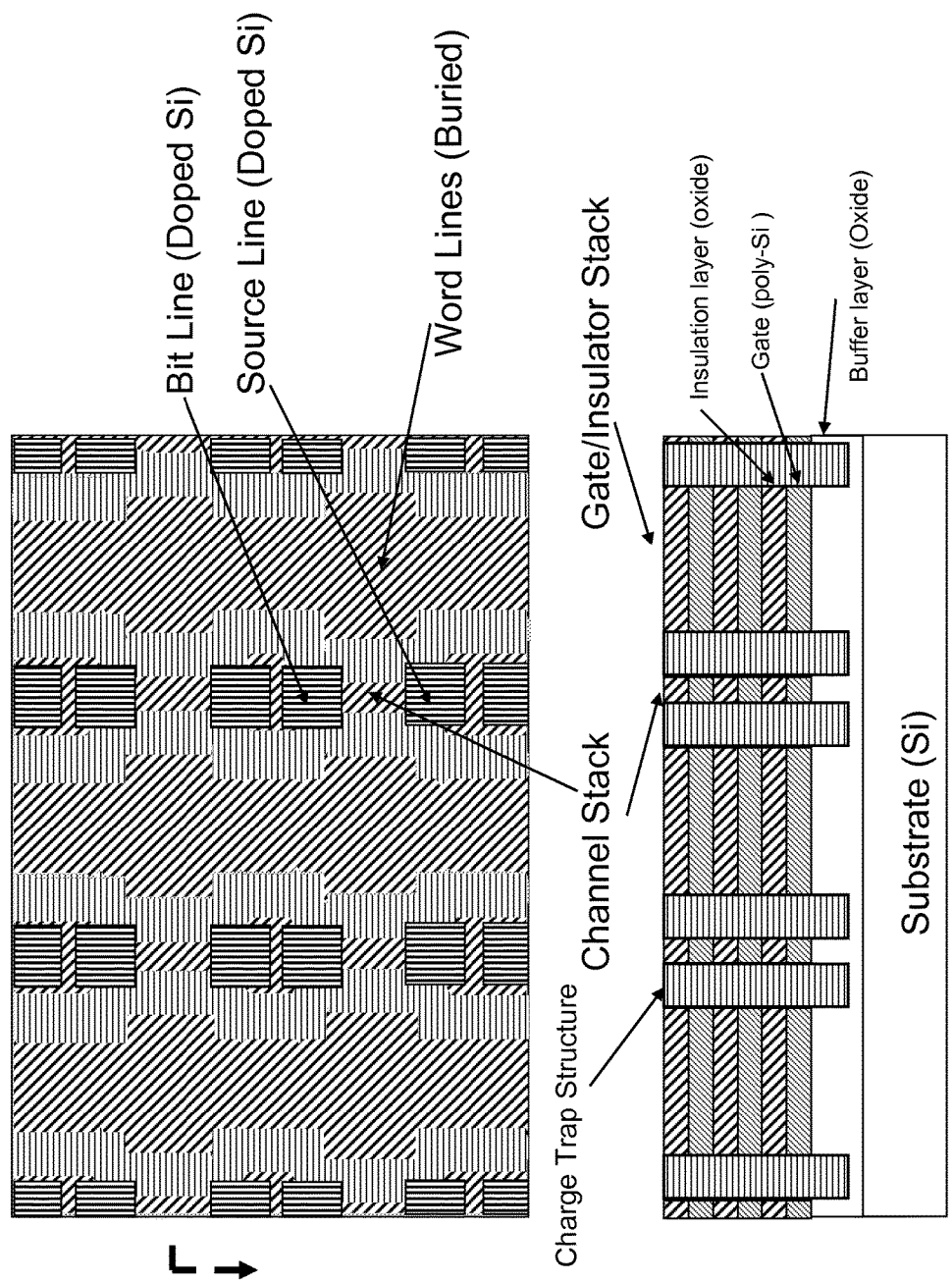

In another embodiment, the present invention comprises device fabrication methods for implementing arrays of the basic NOR memory group of FIG. 2 to form three-dimensional NOR memory. One example device fabrication process is illustrated in FIGS. 6a-6c. Here a vertical channel stack of alternating doped-semiconductor/insulator layers (e.g., doped poly-Si/$SiO_2$) provides parallel conduction channels for all FETs within the basic NOR memory group. Such a channel stack can be made from the same multilayer stack of gate/insulator (FIG. 6a) by a lithography step and masked etching after blanket deposition of alternating layers of doped poly-Si/$SiO_2$ by LPCVD. After that, a charge trap structure is prepared (FIG. 6b) by a process similar to what is described for FIG. 5. Subsequently, the electrodes for Bit Line and Source Line are patterned by masked etching of holes all the way through the channel stack and then filling the holes with degenerately doped epitaxial Si by CVD or poly-Si by LPCVD (FIG. 6c).

Figure 7:
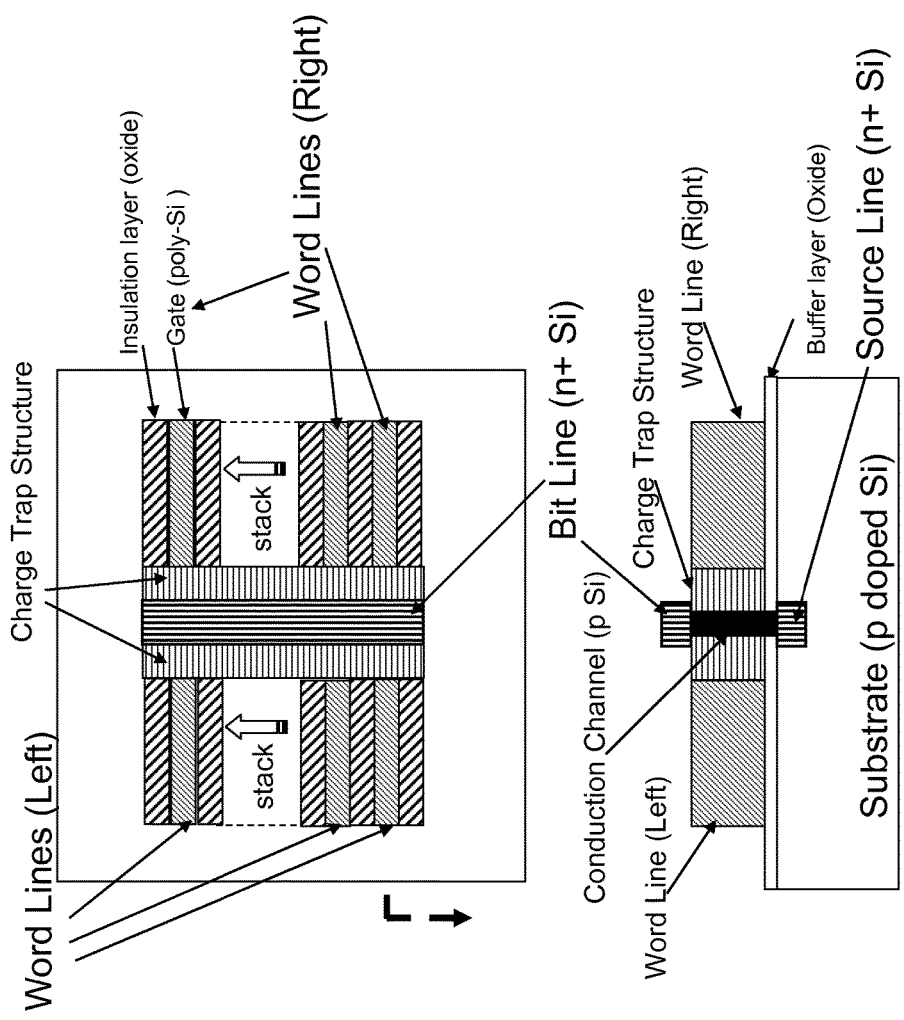
FIG. 7 show schematically a top view (upper panel) and a cross-sectional view (lower panel) for a planar basic NOR memory group in which individual memory cells (i.e., FETs) are stacked along a direction parallel to the plane of the substrate and electrically connected in parallel (i.e., sharing the same source and drain electrodes).

In one alternative embodiment, the present invention comprises a planar basic NOR memory group in which individual memory cells (i.e., FETs) are stacked along a direction parallel to (or nearly parallel to) the plane of the substrate and electrically connected in parallel (i.e., sharing the same source and drain electrodes), as illustrated in FIG. 7. Here the Bit Line and the Source Line are located on the top and the bottom of the conduction channel (a piece of semiconductor, e.g., a Si fin), respectively, and two sets of side-gating structures with charge traps are stacked along a direction parallel to the substrate plane. The preferred material configurations and the operation procedures are the same as what were described previously for the vertical basic NOR memory group of FIG. 1. For example, the doping configurations of the conduction channel (taking Si fin as an specific example) and the electrodes of Source and Bit Lines (taking degenerately doped Si as an example) are preferred to be as follows (in the case that an inversion layer serves as the electrical conduction path in the FET ON state): (i) the channel is p-doped Si while these two electrodes (Source and Bit Lines) are degenerately n-doped Si; or (ii) the channel is n-doped Si while these two electrodes (Source and Bit Lines) are degenerately p-doped Si. In the case that an accumulation layer serves as the electrical conduction path in the FET ON state, the channel can be a resistive undoped Si while these two electrodes (Source and Bit Lines) are degenerately doped Si with either type of carrier. Alternatively, the structure of the conduction channel of FIG. 7 can be configured in analogy to those of FIG. 2 and FIG. 3, i.e., the channel can consist of alternating doped-semiconductor/insulator segments (e.g., doped-Si/SiO$_2$) or alternating lightly/heavily doped semiconductor segments (e.g., p Si/p+ Si) along the longitudinal direction (i.e., parallel to the substrate plane), which are aligned with corresponding gate/insulator stacks to form isolated parallel conduction channels between the source and drain electrodes, or the semiconductor channel can be split into two pieces to decouple the left-side gate and the right-side gate. In another alternative configuration, these two side-gates for the basic NOR memory group of FIG. 7 can be connected to form a single gate.

In one alternative embodiment, the present invention comprises other planar basic NOR memory groups similar to that of FIG. 7, but wherein the stacking direction of individual memory cells (i.e., FETs) can be changing (e.g., along meandering directions parallel to or nearly parallel to the plane of the substrate) and the exact shape of the conduction channel (e.g., a Si fin) can be varied as long as the cells are electrically connected in parallel (i.e., sharing the same source and drain electrodes) to implement NOR gate logic.

Figure 8A:
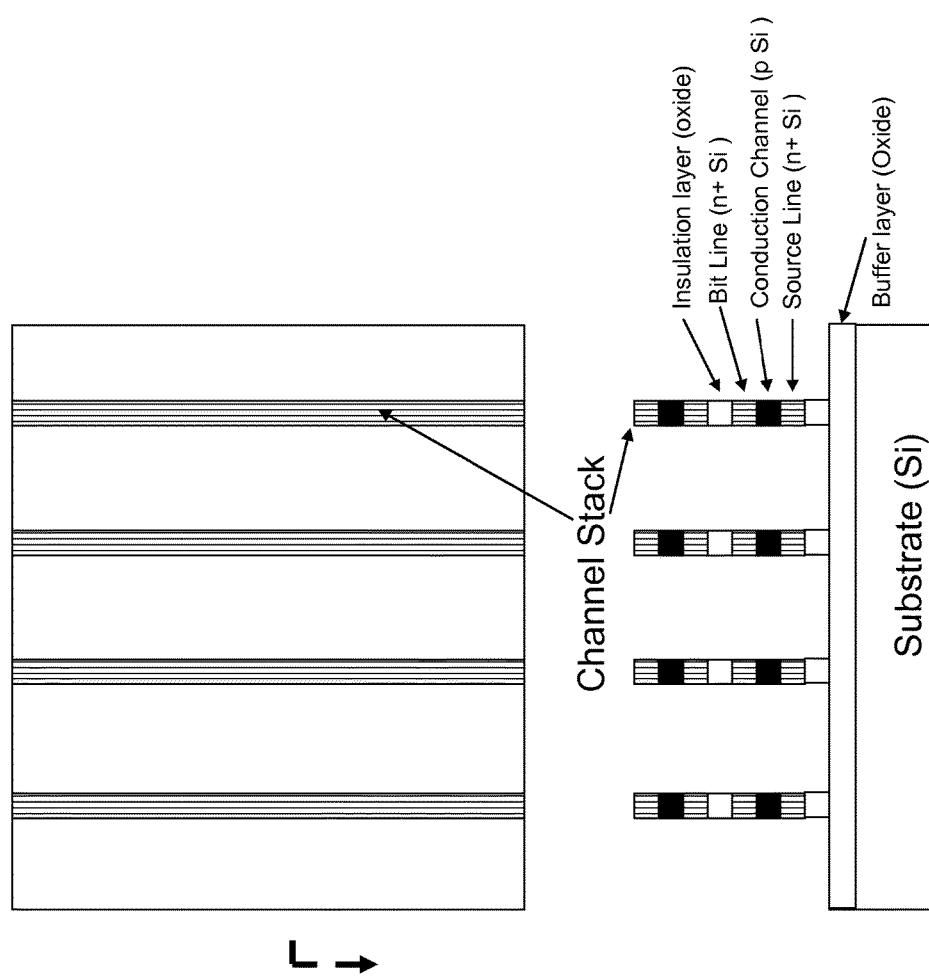
Figure 8B:
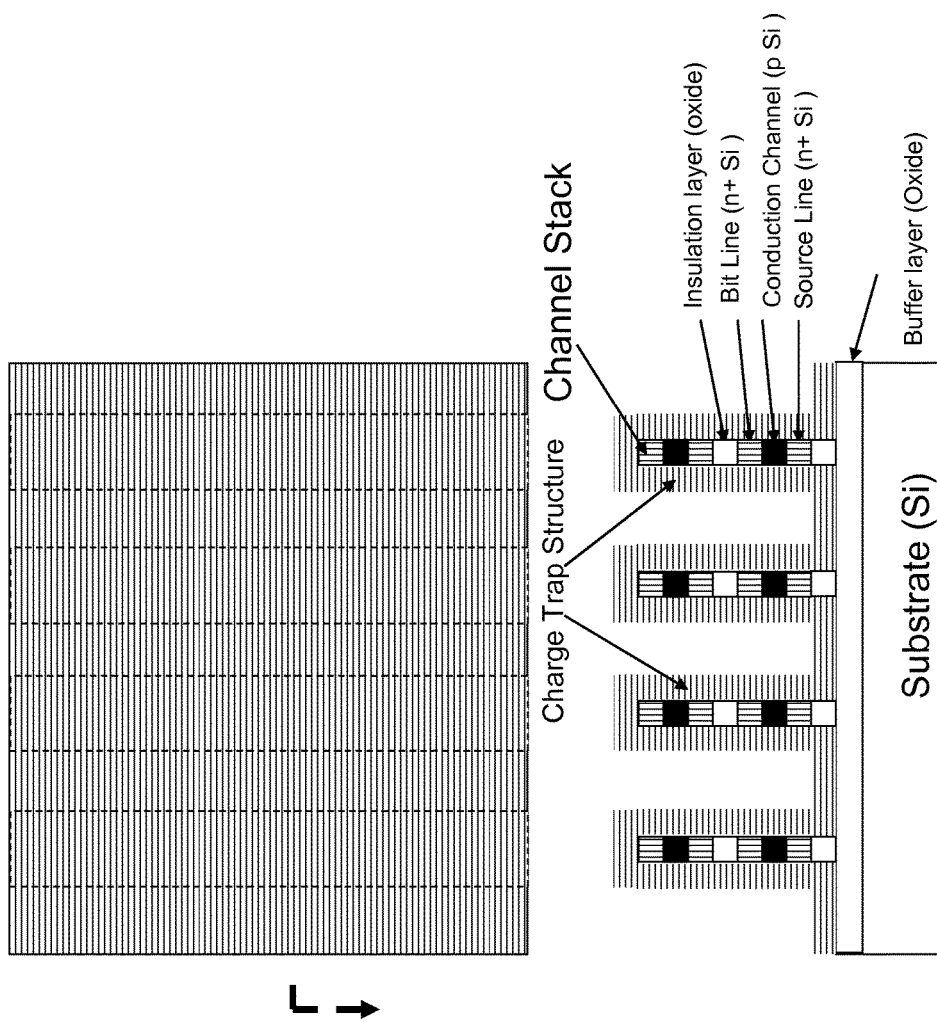
Figure 8D:
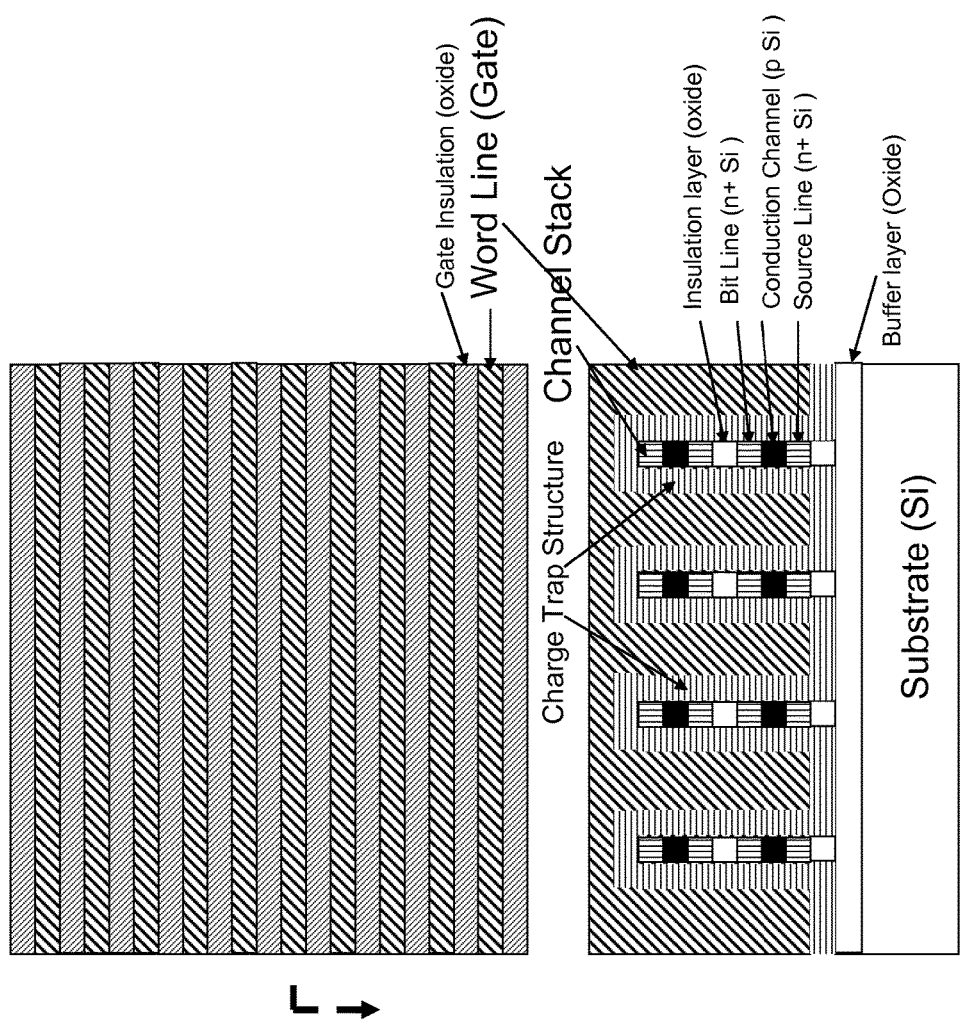

In another embodiment, the present invention comprises device fabrication methods for implementing arrays of the planar basic NOR memory group of FIG. 7 to form three-dimensional NOR memory devices. One example device fabrication process is illustrated in FIGS. 8a-8d. First, alternating stacked four-layer structure of insulator/n+ Si/p Si/n+ Si are deposited on a Si substrate with a buffer oxide layer (or other insulating buffer layer), and then etched into channel stacks (FIG. 8a). Here these n+ Si stripe layers form Source Lines and Bit Lines in columns, and these p Si stripe layers form conduction channels (alternatively, other doping configurations can be adopted according to the previous discussion for FIG. 7). The thickness of the insulator layer, the n+ Si and p Si layer can be from 1 nm to a few µm, but the preferred thickness of the p Si layer (which defines the conduction channel length) is from 10 nm to 100 nm. Alternatively, an optional layer of silicide (e.g. tungsten silicide, cobalt silicide, titanium silicide) can be formed over the top of the Bit Line n+ Si layer and/or below the bottom of the Source Line n+ Si layer to enhance electrical conduction. The number of the repeating four-layer structure (defining planar basic NOR memory groups on a plane level) is variable depending on the desired storage density. After that, a charge trap structure is prepared (FIG. 8b) by a process similar to what was described for FIG. 5. Subsequently, a gate layer (e.g. poly-Si, TaN, or tungsten) is blanket deposited to cover the charge trap structure, planarized (e.g. by chemical mechanical polishing), and then etched into strips (by using selective etching of the gate material but leaving the underneath channel stack un-touched) to form Word Lines in rows (FIG. 8c), followed by deposition of an insulation layer to finalize the device (FIG. 8d). Note that in this configuration of FIG. 8d, the left-side and the right-side gates of any basic NOR memory group are connected together, thus reducing the storage density by half compared with that of FIG. 7. Electrical access to the buried Bit/Source Lines of FIG. 8d can be realized by etching a stair-case pattern into the layers near the edge of the memory arrays, subsequently depositing an insulation layer followed by CMP, etching vias down to connect with buried layers of Bit/Source Lines and filling the vias with conductors.

Figure 9A:
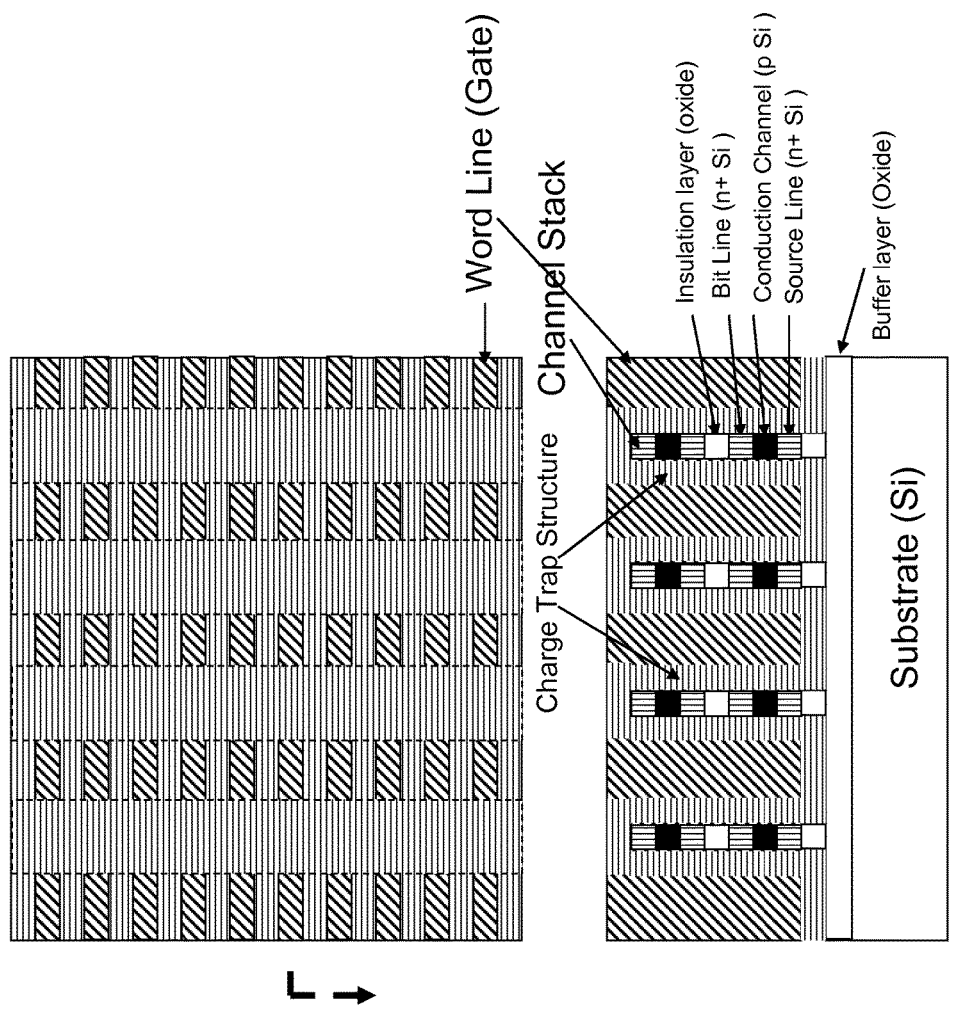
FIGS. 9a-9b show schematic diagrams of another fabrication process modified from FIG. 8 to implement three-dimensional NOR memory devices taking full advantage of the basic NOR memory group of FIG. 7. The top view (upper panel) and cross-sectional view (lower panel) of the device at different fabrication stages are presented. In this design, the left-side and the right-side gates form separated Word Lines in rows.
Figure 9B:
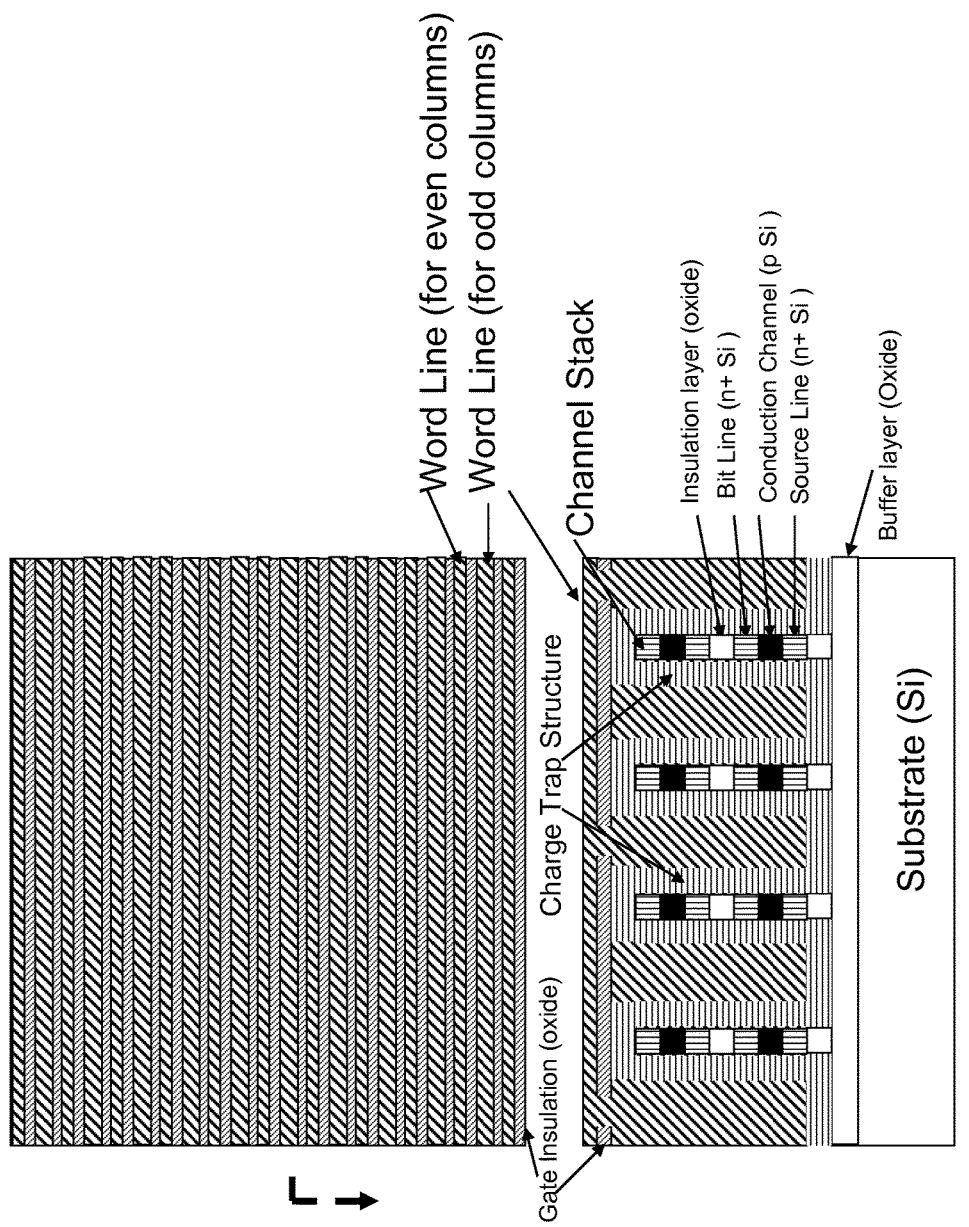

In another alternative embodiment, the example fabrication process of FIG. 8 can be modified to take full advantage of the basic NOR memory group of FIG. 7 by separating the left-side and the right-side gates. Specifically, after the step of FIG. 8c, the gate stripes are etched back to electrically separate the left-side and right-side gates for every basic NOR memory groups (FIG. 9a). Next, a gate insulation layer (e.g., oxide) is blanket deposited to cover the device top surface including the gate stripes. Subsequently, rows of isolated holes are etched through the gate insulation layer to expose left-side gates (odd columns), and other offset rows of isolated holes are etched through the gate insulation layer to expose right-side gates (even columns). Finally, a conductor layer is deposited on the surface and etched into stripes to form Word Lines for even columns (where all right-side gates in a row are connected together via the etched holes) and Word Lines for odd columns (where all left-side gates in a row are connected together via the etched holes), as shown in FIG. 9b.

Figure 10A:
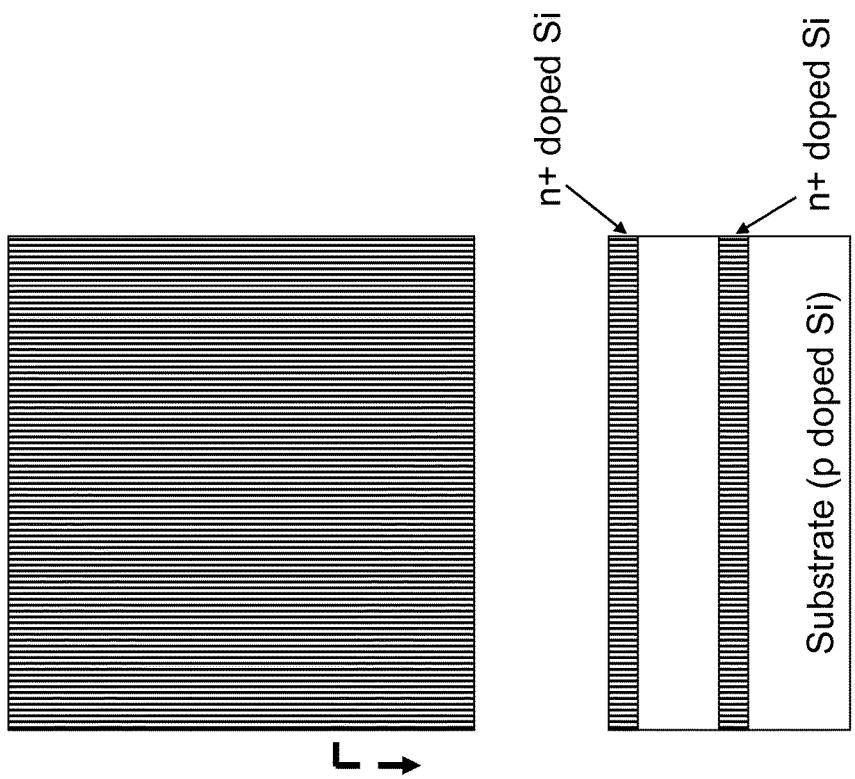
FIGS. 10a-10d show schematic diagrams of an example fabrication process for using a bulk Si wafer to implement a NOR flash memory device consisting of arrays of the planar basic NOR memory group of FIG. 7. The top view (upper panel) and cross-sectional view (lower panel) of the device at different fabrication stages are presented.
Figure 10B:
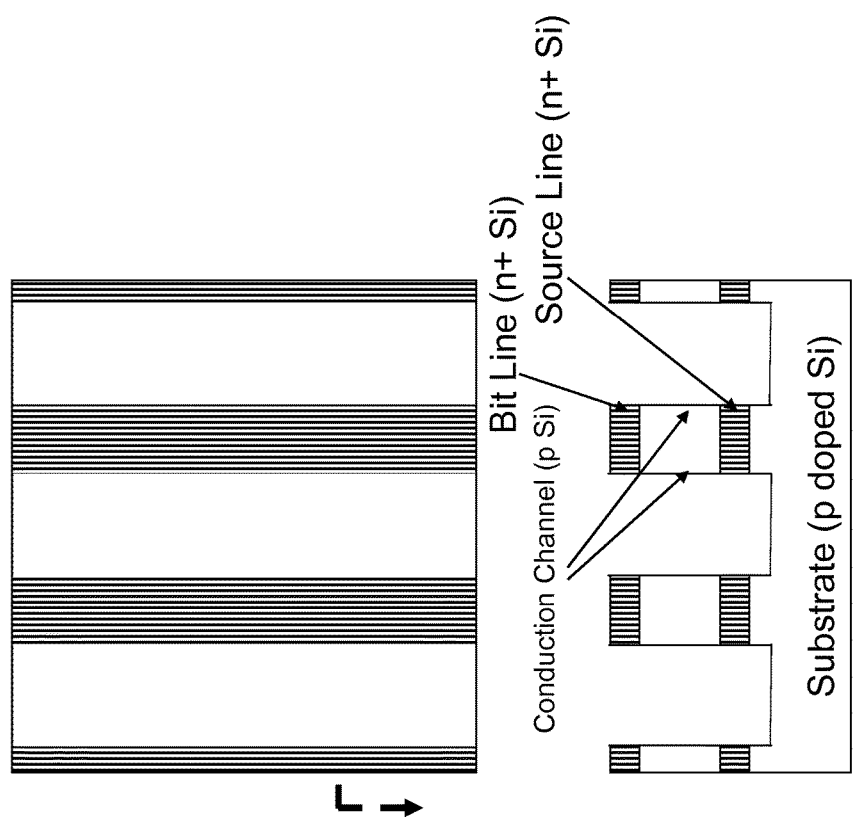
Figure 10C:
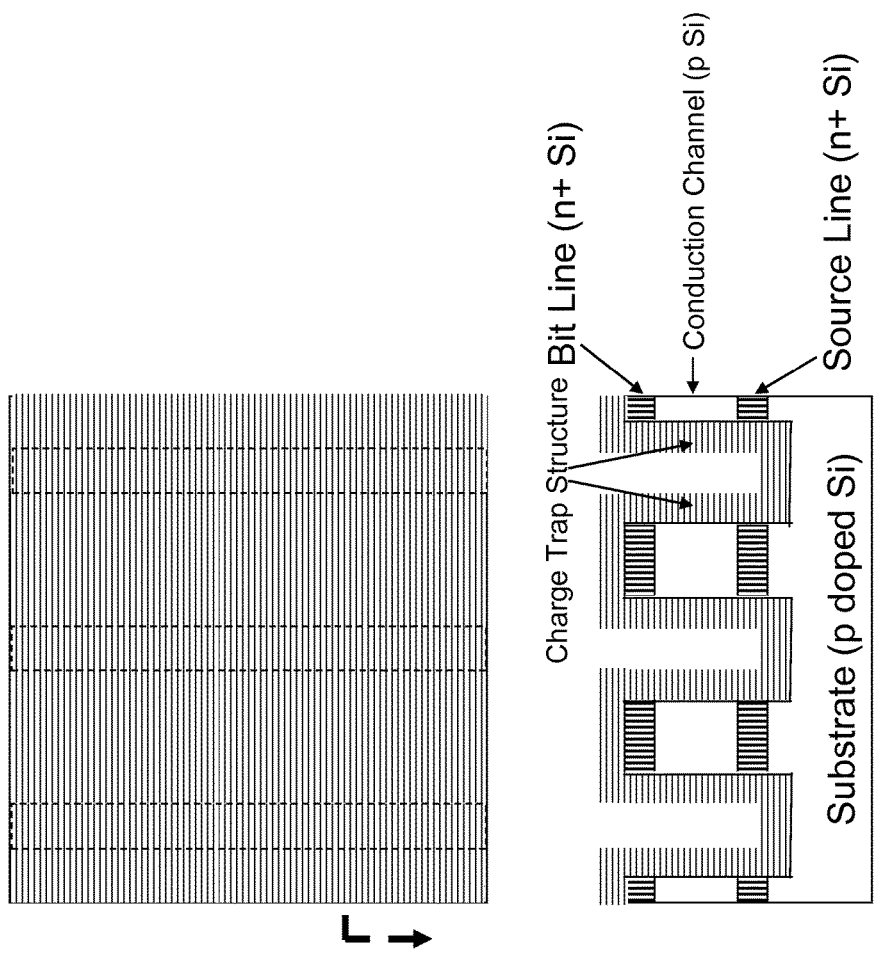
Figure 10D:
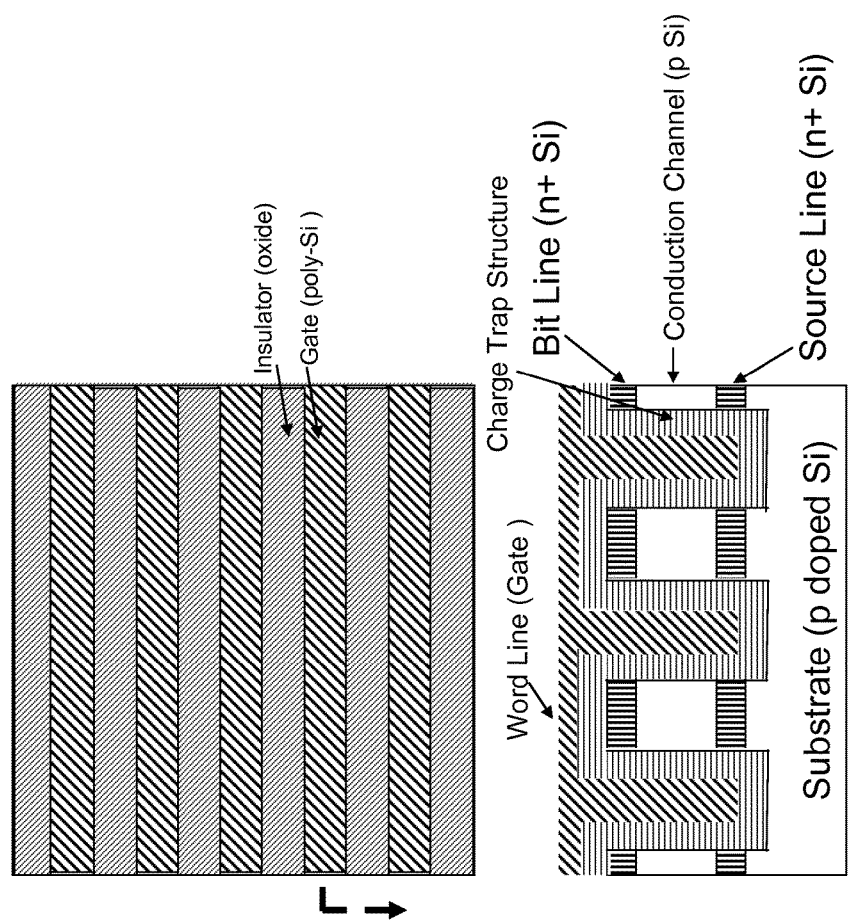

In another embodiment, the present invention comprises device fabrication methods for using a bulk Si wafer to implement a NOR flash memory device consisting of arrays of the planar basic NOR memory group of FIG. 7. FIGS. 10a-10d show schematic diagrams of an example fabrication process using a p-doped Si wafer. First, one can start with a p-doped Si wafer and form two layers of n+ doped Si (FIG. 10a) via ion implantation and rapid thermal annealing (in an alternative configuration, one can also form two p+ doped Si layers in a n-doped Si wafer). Additionally, an optional layer of silicide (e.g. tungsten silicide, cobalt silicide, titanium silicide) can be formed over the top layer of the n+ doped Si. Alternatively, the structure of FIG. 10a can also be produced by epitaxial growth of n+ Si/p Si/n+ Si tri-layers on top of a p-doped Si wafer. The thickness of the n+ Si and p Si layer can be from 1 nm to a few µm, but the preferred thickness of the p Si layer (which defines the conduction channel length) is from 10 nm to 200 nm. Also, an optional cap layer (e.g., Si) can be produced to cover the top n+ Si layer. After that, trenches are patterned (e.g., via photoresist spinning and lithography) and etched into the silicon wafer (FIG. 10b) to define silicon fins (conduction channels) and also to isolate adjacent memory groups. The bottom of the trench is below the level of the lower n+ Si layer (e.g., preferably 5-500 nm below, but this depth is variable as long as the electrical isolation is good enough). For better isolation, an extra step of ion implantation with hole dopant (such as boron) can be adopted to produce a p+ layer at the bottom of the trench (before photoresist covering the top of the Si fin is removed). Charge trap structures are subsequently deposited (FIG. 10c) similar to what were described for FIG. 5. Next, similar to what were previously described for FIGS. 8c and 8d, a gate layer (e.g. poly-Si, TaN, or tungsten) is blanket deposited to cover the charge trap structure, planarized (e.g. by chemical mechanical polishing), and then selectively etched into strips to form Word Lines in rows, followed by deposition of an insulation layer to finalize the device (FIG. 10d). Electrical access to the buried Bit/Source Lines in columns (FIG. 10d) can be realized by etching vias down to reach the Bit/Source Lines near the edge of the memory arrays, and then filling the vias with conductors. Note that in this configuration of FIG. 10d, the left-side and the right-side gates of any basic NOR memory group are connected together. In an alternative configuration, the two side gates can be separated in a way similar to that of FIG. 9.

Figure 11A:
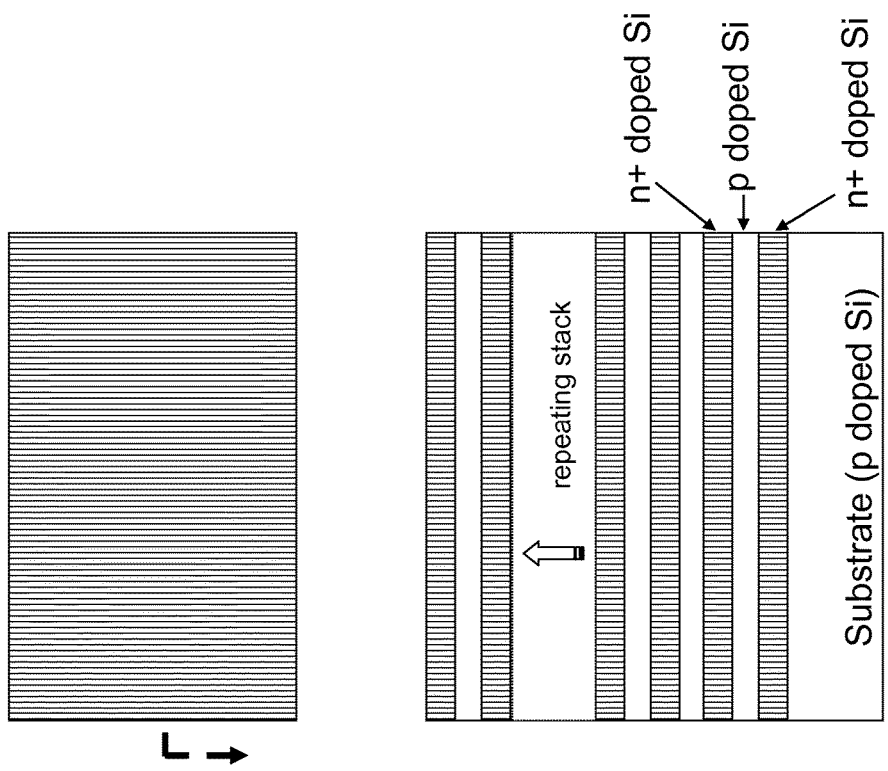
FIGS. 11a-11b show schematic diagrams of an example fabrication process to produce a three-dimensional NOR flash memory device consisting of arrays of stacked basic NOR memory groups of FIG. 7. The top view (upper panel) and cross-sectional view (lower panel) of the device at different fabrication stages are presented.
Figure 11B:
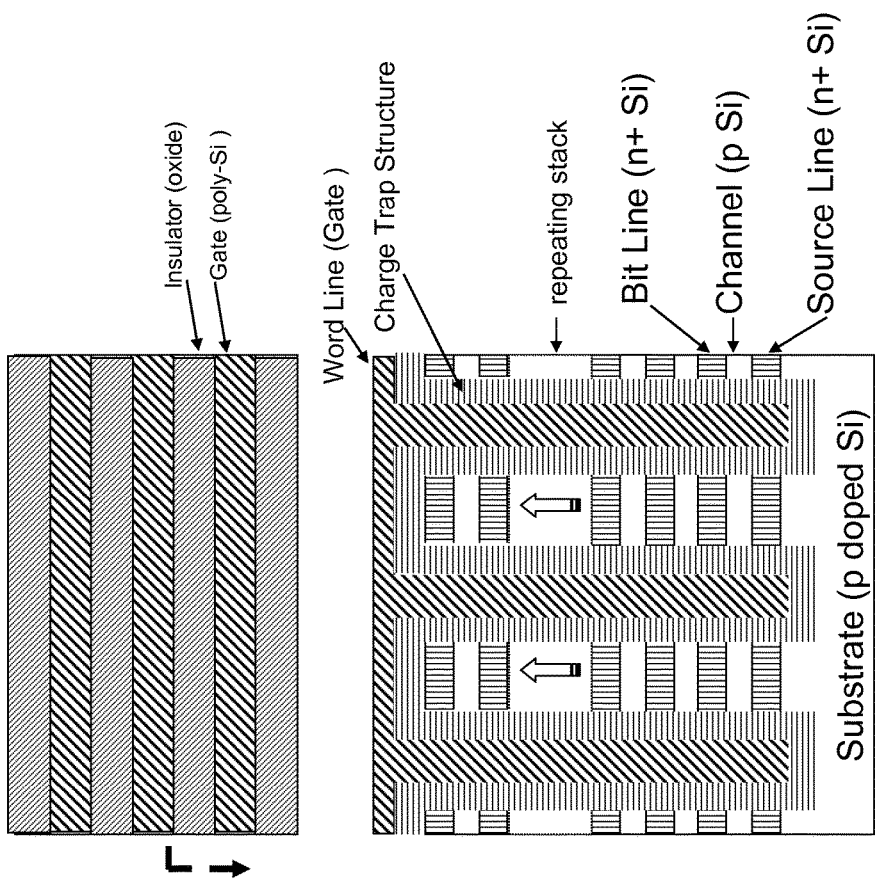

In another embodiment, the present invention comprises a device fabrication method to producing three-dimensional NOR flash memory devices (FIG. 11) consisting of arrays of stacked basic NOR memory groups of FIG. 7. First, the structure of FIG. 11a is produced by epitaxial growth (e.g., via CVD or MBE) of repeated stacks of n+ Si/p Si bi-layers on top of a p-doped Si wafer (or in an alternative configuration, p+ Si/n Si bi-layers on top of a n-doped Si wafer), and then an epitaxial n+ Si layer is grown at the top of the stack. The thickness of the n+ Si and p Si layer can be from 1 nm to a few μm, but the preferred thickness of the p Si layer (which defines the conduction channel length) is from 10 nm to 200 nm. Alternatively, the structure of FIG. 11a can also be produced by repeated ion implantation with different depth profile and then rapid thermal annealing. Also, an optional cap layer (e.g., Si) can be produced to cover the top n+ Si layer. After that, following similar processing outlined previously for FIGS. 10b-10d, three-dimensional NOR flash memory device (FIG. 11b) is realized, with Word Lines arranged in rows and multiple Bit/Source Lines stacked in columns. Electrical access to the buried Bit/Source Lines of FIG. 11b can be realized by etching a stair-case pattern into the layers near the edge of the memory arrays, subsequently depositing an insulation layer followed by CMP, etching vias down to connect with buried layers of Bit/Source Lines and filling the vias with conductors. Note that in FIG. 11b, any two adjacent n+ Si layers along the vertical direction in each column stack can be used as a set of Bit Line/Source Line to address a memory cell defined together by them and a Word Line. For the device of FIG. 11b (effectively a virtual-ground three-dimensional NOR architecture), to read/program/erase a specific memory cell, only the target Bit Line and Source Line are selected while all other Bit/Source Lines must be floated, in order to avoid interference between the cells in the same column stack.

In another embodiment of the present invention, the whole device layer of FIG. 10 can be stacked one by one, and then electrically connected to form three dimensional NOR memory devices. For example, starting with two Si wafers having the device of FIG. 10d, one can first passivate the device surface with an insulating layer such as $SiO_2$, followed by planarization with chemical mechanical polishing. Next, one can implant hydrogen ions deep into one Si wafer (well below the device layer) and then perform annealing. After that, these two wafers can be bonded together and then separated from the position of the implanted hydrogen layer, resulting into a two-device-layer stack in one wafer. Similarly, multiple device layers can be stacked and then electrically connected to form three-dimensional NOR memory devices.

Alternatively, NOR flash memory devices consisting of arrays of the planar basic NOR memory group of FIG. 7 can be implemented with a silicon-on-insulator wafer.

The invention claimed is:

1. A basic non-volatile memory group comprising:
   (i) a plurality of individual memory cells each having a source electrode, a drain electrode and at least one side gate, the memory cells being stacked on a planar substrate along a direction out of the plane of the substrate ("vertically") and being electrically connected in parallel by sharing the source electrodes and the drain electrodes, respectively;
   (ii) a piece of semiconductor fin vertically oriented out of the planar substrate providing a plurality of conduction channels for the memory cells with the direction of electrical current flow being approximately parallel to the planar substrate;
   (iii) the shared source and the shared drain electrodes being connected to respective opposite sides of the semiconductor fin;
   (iv) the side gates being vertically stacked and located on the other respective opposite sides of the semiconductor fin; and
   (v) a charge trap structure between the gate electrodes and the conduction channel for trapping electrons as a storage medium for memory cells.

2. The basic memory group of claim 1, wherein the semiconductor fin is replaced by a stack of alternating semiconductor/insulator layers or two pieces of separated semiconductor fin to provide parallel conduction channels for the memory cells within the same basic memory group.

3. The basic memory group of claim 1, wherein the charge trap structure consists of an ONO structure, including a tunneling dielectric layer comprising silicon oxide, a charge storage layer comprising silicon nitride, and a blocking dielectric layer comprising silicon oxide.

4. The basic memory group of claim 1, wherein the charge trap structure has a sandwiched structure, including a tunneling dielectric layer comprising a material selected from a group consisting of $Al_2O_3$, $H_fO_2$ and silicon oxide, a charge storage layer comprising a material selected from a group consisting of silicon nitride, nanometer-sized metal and semiconductor crystals, and a blocking dielectric layer comprising a material selected from a group consisting of $Al_2O_3$, $H_fO_2$ and silicon oxide.

5. The basic memory group of claim 1, wherein the charge trap structure has a bandgap engineered ONO structure, including a tunneling dielectric layer comprising composite materials of sandwiched ultra thin silicon oxide, silicon nitride, and silicon oxide structure to assist electron tunneling.

6. The basic memory group of claim 1, wherein the side-gate structure comprises at least one stack of alternating conductor and insulator layers.

7. The basic memory group of claim 1, wherein a stored information of every individual memory cell can be read out via NOR gate logic.

8. A NOR memory block comprising a plurality of rows and columns of the basic memory group of claims 1 and 3-7 to form memory group arrays, wherein the drain electrodes of the plurality of the basic memory groups are electrically connected to form Local Bit Lines, the source electrodes of the plurality of the basic memory groups are electrically connected to form Local Source Lines, and the gate electrodes of the plurality of the basic memory groups are electrically connected to form Word Lines.

9. A memory device comprising a plurality of the NOR memory blocks of claim 8, wherein the NOR memory blocks are connected on a chip level by connecting the Local Bit Lines of the NOR memory blocks to Global Bit Lines and connecting the Local Source Lines of the NOR memory blocks to Global Source Lines, and thus can be selectively addressed for operations comprising reading, programming, and erasing on any individual memory cell.

10. The basic memory group of claim 1, comprising a buffer layer between the memory cells and the substrate.

* * * * *